United States Patent
Nishi et al.

(10) Patent No.: US 12,402,337 B2
(45) Date of Patent: Aug. 26, 2025

(54) SEMICONDUCTOR DEVICE AND METHOD FOR CONTROLLING SEMICONDUCTOR DEVICE

(71) Applicant: Mitsubishi Electric Corporation, Tokyo (JP)

(72) Inventors: Koichi Nishi, Tokyo (JP); Masanori Tsukuda, Tokyo (JP); Shinya Soneda, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 470 days.

(21) Appl. No.: 17/845,833

(22) Filed: Jun. 21, 2022

(65) Prior Publication Data
US 2023/0073864 A1 Mar. 9, 2023

(30) Foreign Application Priority Data
Sep. 6, 2021 (JP) .................................. 2021-144695

(51) Int. Cl.
| | |
|---|---|
| *H10D 12/00* | (2025.01) |
| *H10D 30/66* | (2025.01) |
| *H10D 62/17* | (2025.01) |
| *H10D 64/27* | (2025.01) |

(52) U.S. Cl.
CPC ......... *H10D 12/481* (2025.01); *H10D 30/668* (2025.01); *H10D 62/393* (2025.01); *H10D 64/513* (2025.01)

(58) Field of Classification Search
CPC .. H10D 12/481; H10D 64/513; H10D 30/668; H10D 30/0223; H10D 30/0275; H10D 30/283; H10D 62/393; H10D 62/40; H10D 62/605
See application file for complete search history.

(56) References Cited

U.S. PATENT DOCUMENTS

| | | | |
|---|---|---|---|
| 2017/0250685 A1 | 8/2017 | Bina et al. | |
| 2020/0126973 A1* | 4/2020 | Kamibaba | H10D 84/403 |
| 2021/0091072 A1* | 3/2021 | Matsudai | H01L 29/8613 |
| 2021/0376167 A1* | 12/2021 | Soneda | H01L 29/8613 |
| 2022/0165727 A1* | 5/2022 | Kuroda | H10D 12/481 |
| 2022/0376605 A1* | 11/2022 | Rahimo | H02M 1/088 |

FOREIGN PATENT DOCUMENTS

| | | |
|---|---|---|
| JP | 2013-251395 A | 12/2013 |
| JP | 5768395 B2 | 8/2015 |
| JP | 2017-163136 A | 9/2017 |

* cited by examiner

*Primary Examiner* — Shaun M Campbell
(74) *Attorney, Agent, or Firm* — Studebaker Brackett PLLC

(57) ABSTRACT

When a positive gate voltage is applied to a first one of a first gate electrode and a second gate electrode, and current flows from a collector electrode to an emitter electrode, a semiconductor device applies a positive gate voltage to a second one of the first gate electrode and the second gate electrode. When a positive gate voltage is applied to the first one and current flows from the emitter electrode to the collector electrode, the semiconductor device applies voltage equal to or less than reference voltage to the second one.

18 Claims, 24 Drawing Sheets

F I G. 2
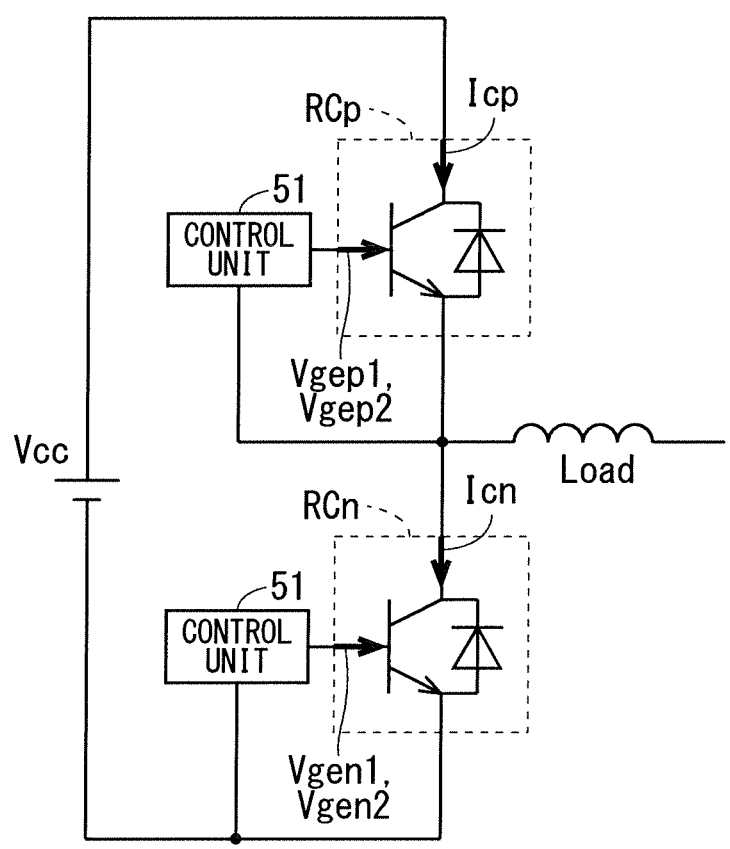

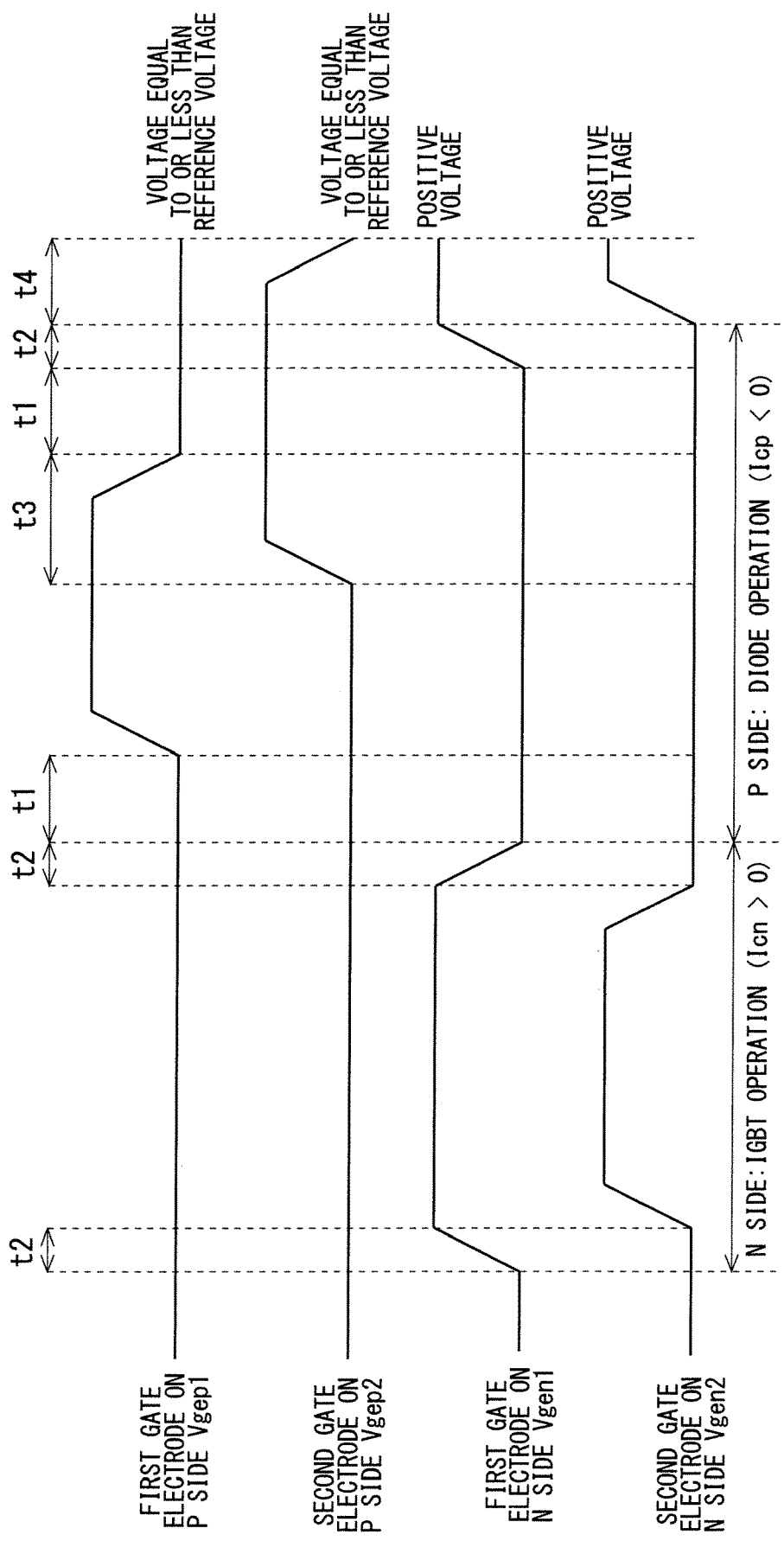
F I G. 5

F I G. 8
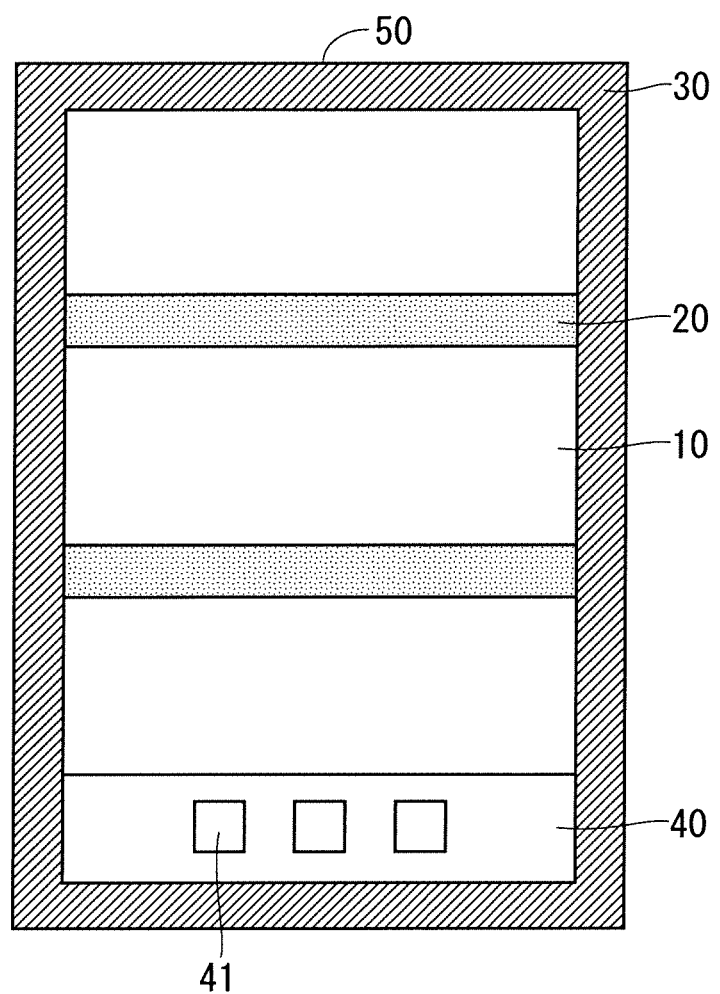

F I G. 1 2
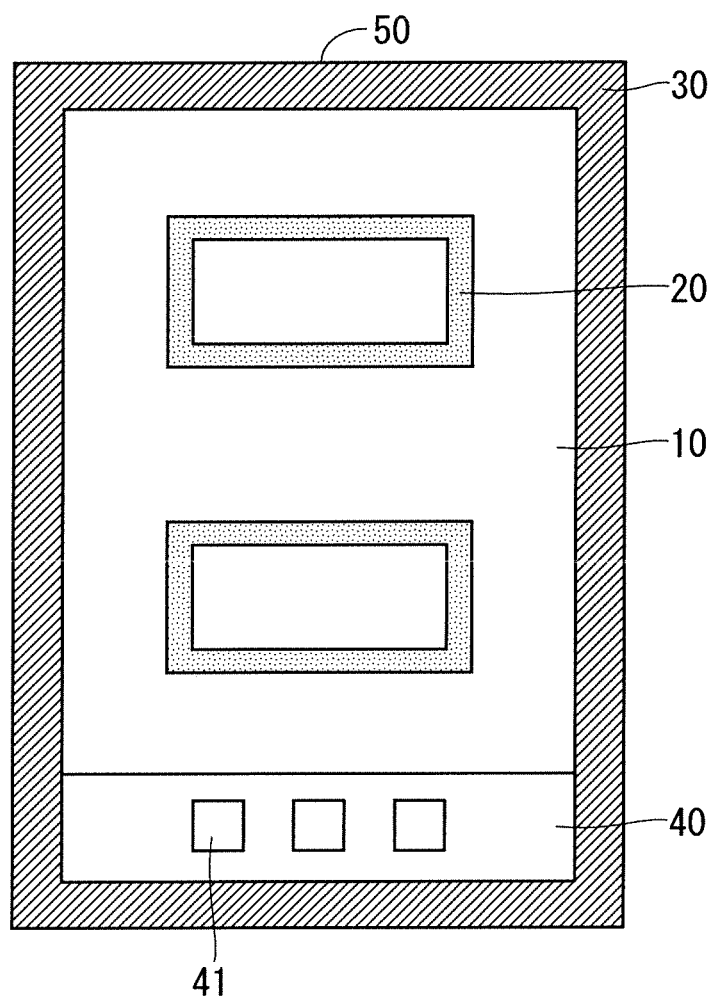

SEMICONDUCTOR DEVICE AND METHOD FOR CONTROLLING SEMICONDUCTOR DEVICE

BACKGROUND OF THE INVENTION

Field of the Invention

The present disclosure relates to a semiconductor device and a method for controlling the semiconductor device.

Description of the Background Art

In the fields of general-purpose inverters, AC servomotors, and the like, an insulated gate bipolar transistor (IGBT) and a diode are used for power modules and the like that perform variable speed control of a three-phase motor from the viewpoint of energy saving. In order to reduce inverter loss, an IGBT and a diode having low switching loss and low on-voltage are required.

A reverse conducting IGBT (RC-IGBT) has been proposed as a device in which an IGBT and a diode are integrated in one chip. Further, for example, Japanese Patent No. 5768395 proposes a technique of inputting separate control signals to an upper electrode and a lower electrode of a split gate structure.

However, in the related art, since a voltage is applied to a first gate electrode and a second gate electrode corresponding to the upper electrode and the lower electrode based on a recovery timing and a carrier lifetime of a diode, there has been a problem that control of voltage application is complicated.

SUMMARY

The present disclosure has been made in view of the above problem, and an object of the present disclosure is to provide a technique capable of facilitating control of voltage application in a semiconductor device.

A semiconductor device according to the present disclosure includes a semiconductor substrate including a first main surface and a second main surface opposite to the first main surface. The semiconductor substrate includes a drift layer of a first conductivity type provided between the first main surface and the second main surface, a carrier accumulation layer of the first conductivity type provided on the first main surface side of the drift layer, a base layer of a second conductivity type provided on the first main surface side of the carrier accumulation layer, an emitter layer of the first conductivity type selectively provided on the first main surface side of the base layer, a buffer layer of the first conductivity type provided on the second main surface side of the drift layer, and a collector layer of the second conductivity type and a cathode layer of the first conductivity type provided on the second main surface side of the buffer layer. The semiconductor device further includes a gate insulating film provided on an inner wall of a trench that penetrates the emitter layer, the base layer, and the carrier accumulation layer from the first main surface side and reaches the drift layer, a first gate electrode provided on the inner wall on the first main surface side with the gate insulating film interposed between them, and having an end portion closer to the second main surface than an end portion of the base layer on the first main surface side, a second gate electrode insulated from the first gate electrode, provided on the inner wall on the second main surface side with the gate insulating film interposed between them, and having an end portion closer to the first main surface than an end portion of the base layer on the second main surface side, an emitter electrode provided on the first main surface, a collector electrode provided on the second main surface, and a control unit, wherein in a case where the control unit applies a positive gate voltage to a first one of the first gate electrode and the second gate electrode, and current flows from the collector electrode to the emitter electrode, the control unit applies a positive gate voltage to a second one of the first gate electrode and the second gate electrode, and in a case where the control unit applies a positive gate voltage to the first one, and current flows from the emitter electrode to the collector electrode, the control unit applies a voltage equal to or less than a reference voltage to the second one.

It is possible to facilitate control of voltage application in the semiconductor device.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 2 is a circuit diagram illustrating a connection example of a semiconductor element according to the first preferred embodiment;

FIGS. 4 and 5 are each a timing chart illustrating operation of a semiconductor device according to a second preferred embodiment;

FIGS. 8 and 9 are each a plan view illustrating a configuration of a semiconductor device according to a fourth preferred embodiment;

FIGS. 12 and 13 are each a plan view illustrating a configuration of a semiconductor device according to a sixth preferred embodiment;

DESCRIPTION OF THE PREFERRED EMBODIMENTS

Figure 1:
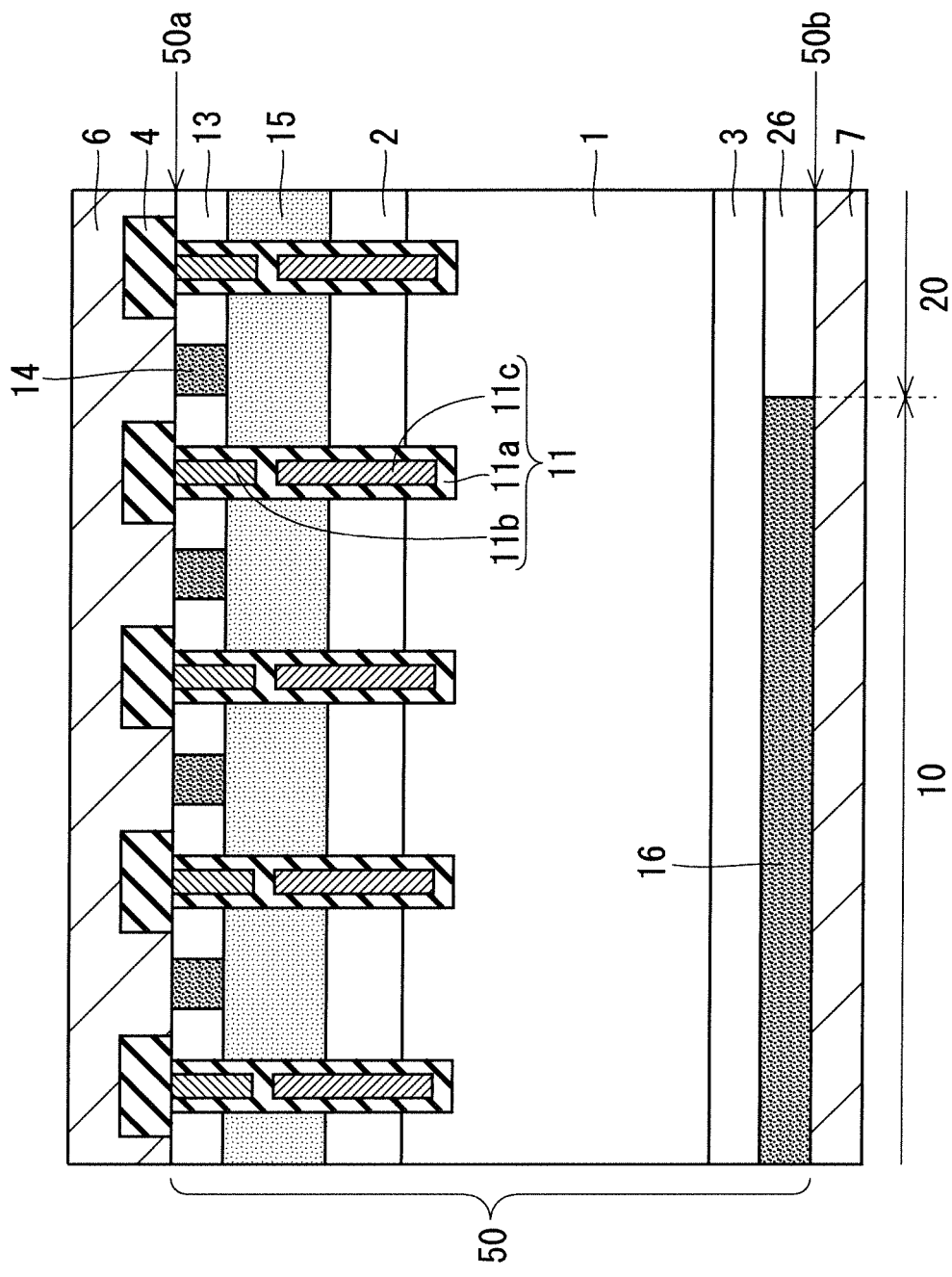
FIG. 1 is a cross-sectional view illustrating a configuration of a semiconductor device according to a first preferred embodiment.

Hereinafter, a preferred embodiment will be described with reference to the attached drawings. Features described in the following preferred embodiments are examples, and all features are not necessarily essential. Further, in description below, similar constituent elements in a plurality of preferred embodiments are denoted by the same or similar reference numerals, and a different constituent element will be mainly described. Further, in description below, specific positions and directions such as "upper", "lower", "left", "right", "front", or "back" may not necessarily coincide with actual positions and directions in practice. Further, that a certain portion has a higher concentration than another portion means that, for example, an average of concentrations of the certain portion is higher than an average of concentrations of the another portion. Conversely, that a certain portion has a lower concentration than another portion means that, for example, an average of concentrations of the certain portion is lower than an average of concentrations of the another portion. Further, in description below, a first conductivity type is n-type and a second conductivity type is p-type, but the first conductivity type may be p-type and the second conductivity type may be n-type.

First Preferred Embodiment

FIG. 1 is a cross-sectional view illustrating a configuration of a semiconductor element included in a semiconductor device according to a first preferred embodiment. Hereinafter, a case where the semiconductor element is an RC-IGBT will be described as an example.

The semiconductor element of FIG. 1 includes a semiconductor substrate 50. The semiconductor substrate 50 has a first main surface 50a and a second main surface 50b on the opposite side to the first main surface 50a. The semiconductor substrate 50 includes a drift layer 1 of a first conductivity type, a carrier accumulation layer 2 of the first conductivity type, a base layer 15 of a second conductivity type, an emitter layer 13 of the first conductivity type, a contact layer 14 of the second conductivity type, a buffer layer 3 of the first conductivity type, a collector layer 16 of the second conductivity type, and a cathode layer 26 of the first conductivity type.

The drift layer 1 is provided between the first main surface 50a and the second main surface 50b. The carrier accumulation layer 2 is provided on the first main surface 50a side of the drift layer 1. For example, an impurity concentration of the first conductivity type of the carrier accumulation layer 2 is higher than an impurity concentration of the first conductivity type of the drift layer 1.

The base layer 15 is provided on the first main surface 50a side of the carrier accumulation layer 2. The emitter layer 13 is selectively provided on the first main surface 50a side of the base layer 15. The contact layer 14 is selectively provided on the first main surface 50a side of the base layer 15 and is adjacent to the emitter layer 13. For example, an impurity concentration of the second conductivity type of the contact layer 14 is higher than an impurity concentration of the second conductivity type of the base layer 15. Note that a portion of the contact layer 14 in FIG. 1 may be the base layer 15.

The buffer layer 3 is provided on the second main surface 50b side of the drift layer 1. For example, an impurity concentration of the first conductivity type of the buffer layer 3 is higher than an impurity concentration of the first conductivity type of the drift layer 1. The collector layer 16 is selectively provided on the second main surface 50b side of the buffer layer 3. The cathode layer 26 is selectively provided on the second main surface 50b side of the buffer layer 3 and is adjacent to the collector layer 16. For example, an impurity concentration of the first conductivity type of the cathode layer 26 is higher than an impurity concentration of the first conductivity type of the buffer layer 3.

The semiconductor element in FIG. 1 includes a gate insulating film 11a, a first gate electrode 11b, a second gate electrode 11c, an interlayer insulating film 4, an emitter electrode 6, and a collector electrode 7. The gate insulating film 11a, the first gate electrode 11b, and the second gate electrode 11c constitute an active trench 11.

The gate insulating film 11a is provided on an inner wall of a trench that penetrates the emitter layer 13, the base layer 15, and the carrier accumulation layer 2 from the first main surface 50a side and reaches the drift layer 1.

The first gate electrode 11b is provided on an inner wall of the trench on the first main surface 50a side with the gate insulating film 11a interposed between them. The first gate electrode 11b has an end portion closer to the second main surface 50b than an end portion of the base layer 15 on the first main surface 50a side.

The second gate electrode 11c is provided on an inner wall of the trench on the second main surface 50b side with the gate insulating film 11a interposed between them. The second gate electrode 11c is insulated from the first gate electrode 11b by, for example, the gate insulating film 11a. The second gate electrode 11c has an end portion closer to the first main surface 50a than an end portion of the base layer 15 on the second main surface 50b side.

The interlayer insulating film 4 is provided on the first main surface 50a of the semiconductor substrate 50, and is provided with an opening portion for exposing the contact layer 14. The emitter electrode 6 is provided on the first main surface 50a of the semiconductor substrate 50 and the interlayer insulating film 4, and is electrically connected to the contact layer 14 in the opening portion of the interlayer insulating film 4.

The collector electrode 7 is provided on the second main surface 50b of the semiconductor substrate 50.

One or more sets of the emitter layer 13, the gate insulating film 11a, the first gate electrode 11b, and the second gate electrode 11c are provided on the first main surface 50a side, and are provided in an IGBT region 10 corresponding to the collector layer 16 in plan view. In the IGBT region 10, an IGBT is realized by the drift layer 1, the emitter electrode 6, the collector electrode 7, the gate insulating film 11a, the first gate electrode 11b, the second gate electrode 11c, the emitter layer 13, the base layer 15, the collector layer 16, and the like. In a diode region 20 corresponding to the cathode layer 26 in plan view, a diode is realized by the drift layer 1, the collector electrode 7, the contact layer 14, the base layer 15, the cathode layer 26, and the like.

FIG. 2 is a circuit diagram illustrating a connection example of the semiconductor element of FIG. 1. FIG. 2 illustrates an example in which two RC-IGBTs each of which is the semiconductor element of FIG. 1 are fully bridge-connected to a power supply Vcc, and load current flows through an inductor which is a load Load.

Hereinafter, in order to distinguish the two semiconductor elements in FIG. 1, the semiconductor element on the P side is referred to as a semiconductor element RCp, and the semiconductor element on the N side is referred to as a semiconductor element RCn. Further, collector current flowing through each of the semiconductor elements RCp and RCn is positive in the direction in which the current flows from the collector electrode 7 toward the emitter electrode 6. Collector current, a first gate electrode voltage, and a second gate electrode voltage of the semiconductor element RCp are referred to as Icp, Vgep1, and Vgep2, respectively, and collector current, a first gate electrode voltage, and a second gate electrode voltage of the semiconductor element RCn are referred to as Icn, Vgen1, and Vgen2, respectively.

The semiconductor device according to the first preferred embodiment includes a control unit 51. The control unit 51 is realized by, for example, a current detection device, a central processing unit (CPU), and the like. The control unit 51 applies a positive gate voltage to a first one of the first gate electrode 11b and the second gate electrode 11c. Further, based on the direction of the current flowing between the emitter electrode 6 and the collector electrode 7, the control unit 51 applies a positive gate voltage or a voltage equal to or less than a reference voltage to a second one of the first gate electrode 11b and the second gate electrode 11c. The voltage equal to or less than the reference voltage here includes a negative gate voltage or a reference voltage (corresponding to 0 V).

Hereinafter, it is assumed that the first one of the gate electrodes is the first gate electrode 11b and the second one is the second gate electrode 11c, but the first one may be the second gate electrode 11c and the second one may be the first gate electrode 11b. Note that the two control units 51 in FIG. 2 may be realized by one control unit.

Figure 3:
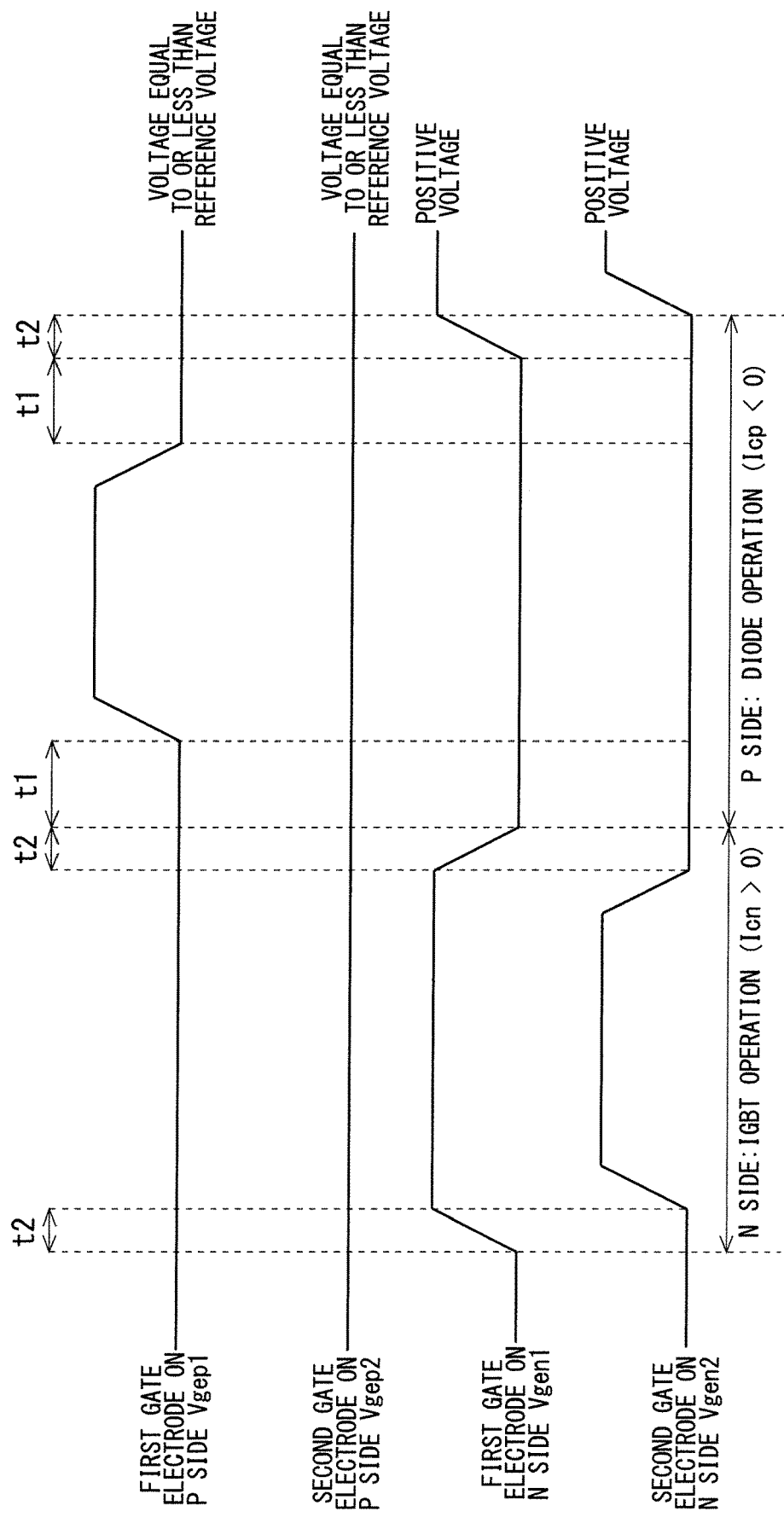
FIG. 3 is a timing chart illustrating operation of the semiconductor device according to the first preferred embodiment.

FIG. 3 is a timing chart illustrating application control by the control unit 51 according to the first preferred embodiment. FIG. 3 illustrates an example in which a control signal (for example, a PWM signal) is input to the first gate electrode 11b of the semiconductor elements RCn and RCp, the semiconductor element RCn on the N side operates as an IGBT, and the semiconductor element RCp on the P side operates as a diode.

The control unit 51 inputs a positive gate control signal voltage, which is a positive gate voltage, to the first gate electrode 11b of the semiconductor elements RCp and RCn at different timings, like Vgep1 and Vgen1. Note that, as Vgen1 and Vgep1, a delay of dead time t1 may be provided between the semiconductor element RCp and the semiconductor element RCn with respect to input of the positive gate control signal voltage.

In the semiconductor element RCn on the N side, when the positive gate control signal voltage is input to the first gate electrode 11b and the collector current is in the positive direction (that is, Icn>0), the control unit 51 inputs the positive gate control signal voltage to the second gate electrode 11c as in Vgen2. By such control, an inversion layer of the first conductivity type is formed on the base layer 15 adjacent to the first gate electrode 11b and the second gate electrode 11c, and the emitter layer 13 is electrically connected to the carrier accumulation layer 2 and the drift layer 1, so that the semiconductor element RCn on the N side operates as an IGBT. As in Vgen1 and Vgen2, a delay of time t2 may be provided between input of the positive gate control signal voltage to the second gate electrode 11c and input of the positive gate control signal voltage to the first gate electrode 11b.

In the semiconductor element RCp on the P side, when the positive gate control signal voltage is input to the first gate electrode 11b and the collector current is in the negative direction (that is, Icp<0), the control unit 51 inputs a voltage equal to or less than the reference voltage to the second gate electrode 11c as Vgep2. By such control, the inversion layer of the first conductivity type is not formed on the base layer 15 adjacent to the second gate electrode 11c, and the emitter layer 13 is not electrically connected to the carrier accumulation layer 2 and the drift layer 1, so that the semiconductor element RCp on the P side operates as a diode. Note that since carriers supplied from the cathode layer 26 are accumulated in the drift layer 1 due to such electrical non-conduction, an on-voltage VF of a diode can be reduced.

Although not illustrated, with respect to the semiconductor element RCn on the N side when the positive gate control signal voltage is input to the first gate electrode 11b and the collector current is in the negative direction (that is, Icn<0), the control unit 51 inputs a voltage equal to or less than the reference voltage to the second gate electrode 11c. For this reason, at this time, the semiconductor element RCn on the N side operates as a diode. With respect to the semiconductor element RCp on the P side, when the positive gate control signal voltage is input to the first gate electrode 11b and the collector current is in the positive direction (that is, Icp>0), the control unit 51 inputs the positive gate control signal voltage to the second gate electrode 11c. For this reason, at this time, the semiconductor element RCp on the P side operates as an IGBT.

Summary of First Preferred Embodiment

In the semiconductor device according to the first preferred embodiment, when the control unit 51 applies a positive gate voltage to the first gate electrode 11b, and current flows from the collector electrode 7 to the emitter electrode 6, the control unit 51 applies a positive gate voltage to the second gate electrode 11c. In contrast, when the control unit 51 applies a positive gate voltage to the first gate electrode 11b, and current flows from the emitter electrode 6 to the collector electrode 7, the control unit 51 applies a voltage equal to or less than the reference voltage to the second gate electrode 11c.

According to such a configuration, the voltage input to the second gate electrode 11c is uniquely determined only by the voltage input to the first gate electrode 11b and whether the collector current is positive or negative. For this reason, it is not necessary to control the voltage application on the basis of a recovery timing of a diode or a carrier lifetime, and thus, it is possible to facilitate the control of the voltage application in the semiconductor device. Further, when the semiconductor element operates as a diode, carriers supplied from the cathode layer 26 are accumulated in the drift layer 1, so that the on-voltage VF of the diode can be reduced.

Second Preferred Embodiment

Figure 4:
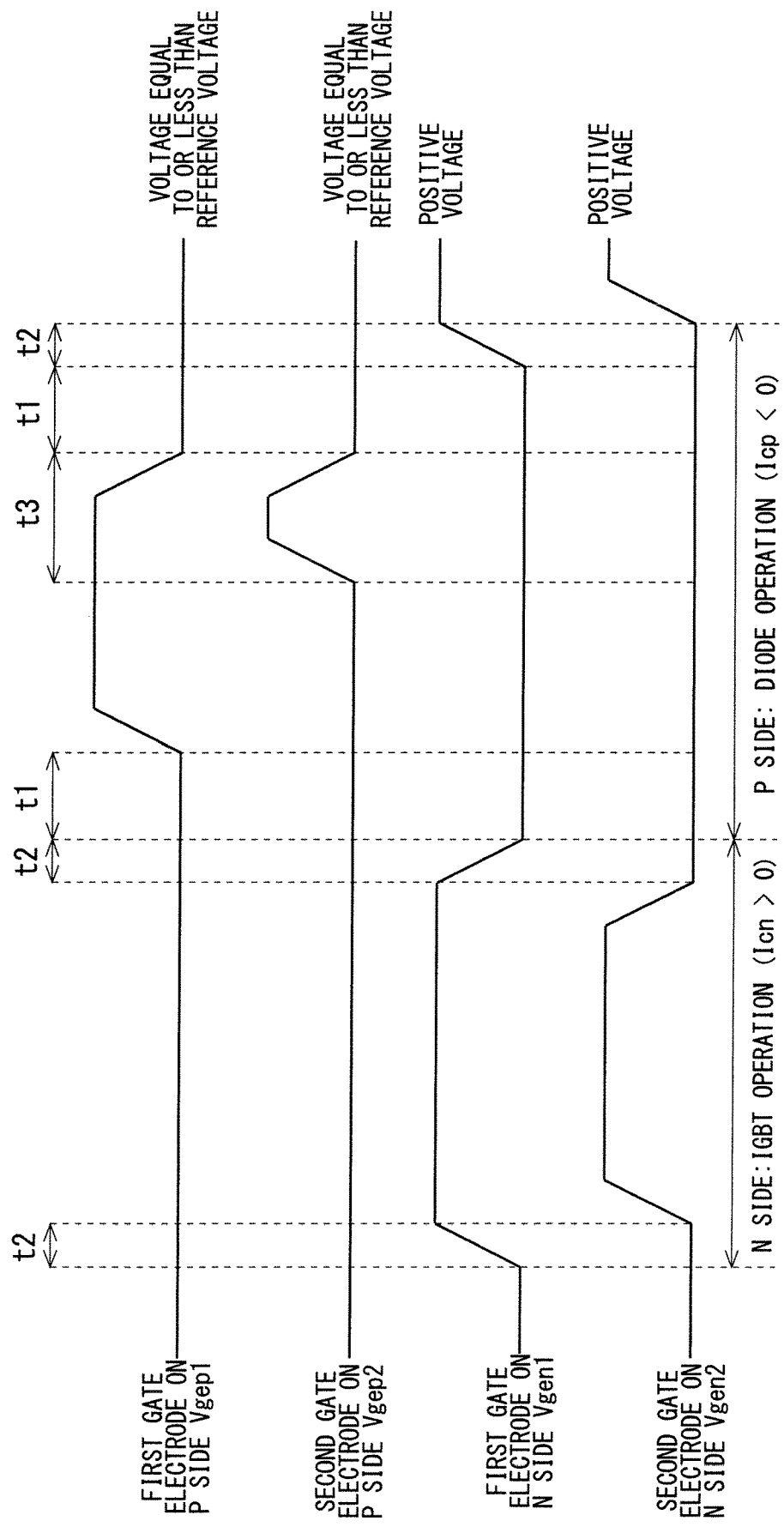

FIG. 4 is a timing chart illustrating application control of the control unit 51 according to a second preferred embodiment. The control unit 51 according to the second preferred embodiment performs application control similar to that of the control unit 51 according to the first preferred embodiment. However, the control unit 51 according to the second preferred embodiment applies a positive gate voltage to both the first gate electrode 11b and the second gate electrode 11c before the voltage applied to the first gate electrode 11b is switched from a positive gate voltage to a voltage equal to or less than the reference voltage, regardless of whether the collector current is positive or negative.

In the example of FIG. 4, a positive gate control signal voltage is input to the first gate electrode 11b and the second gate electrode 11c of the semiconductor element RCp on the P side in a certain period t3 before recovery of the semiconductor element RCp on the P side, such as Vgep1 and Vgep2. As a result, during the certain period t3, an inversion layer of the first conductivity type is formed on the base layer 15 adjacent to the first gate electrode 11b and the second gate electrode 11c of the semiconductor element RCp on the P side, and the emitter layer 13, the carrier accumulation layer 2, and the drift layer 1 electrically conduct.

According to the semiconductor device according to the second preferred embodiment that performs such control, carriers in the drift layer 1 can be discharged to the emitter electrode 6, so that recovery loss can be reduced. Since the recovery loss and the on-voltage VF are in a trade-off relationship, the on-voltage VF of the semiconductor element RCp on the P side increases in the certain period t3. According to the second preferred embodiment, the trade-off relationship can be adjusted by adjusting the certain period t3.

FIG. 5 is a timing chart illustrating another application control of the control unit 51 according to the second preferred embodiment. In the example of FIG. 5, a positive gate control signal voltage is applied to the second gate electrode 11c from the certain period t3 to a certain period t4 after a voltage equal to or less than the reference voltage is applied to the first gate electrode 11b. By such control, recovery loss can be reduced as compared with that in the application control of FIG. 4. Here, during the certain period t4, an inversion layer of the first conductivity type is not formed on the base layer 15 adjacent to the first gate electrode 11b of the semiconductor element RCp on the P side, and the emitter layer 13, the carrier accumulation layer 2, and the drift layer 1 do not electrically conduct. For this reason, it is possible to suppress occurrence of a short circuit between the semiconductor element RCp on the P side and the semiconductor element RCn on the N side.

Third Preferred Embodiment

Figure 6:
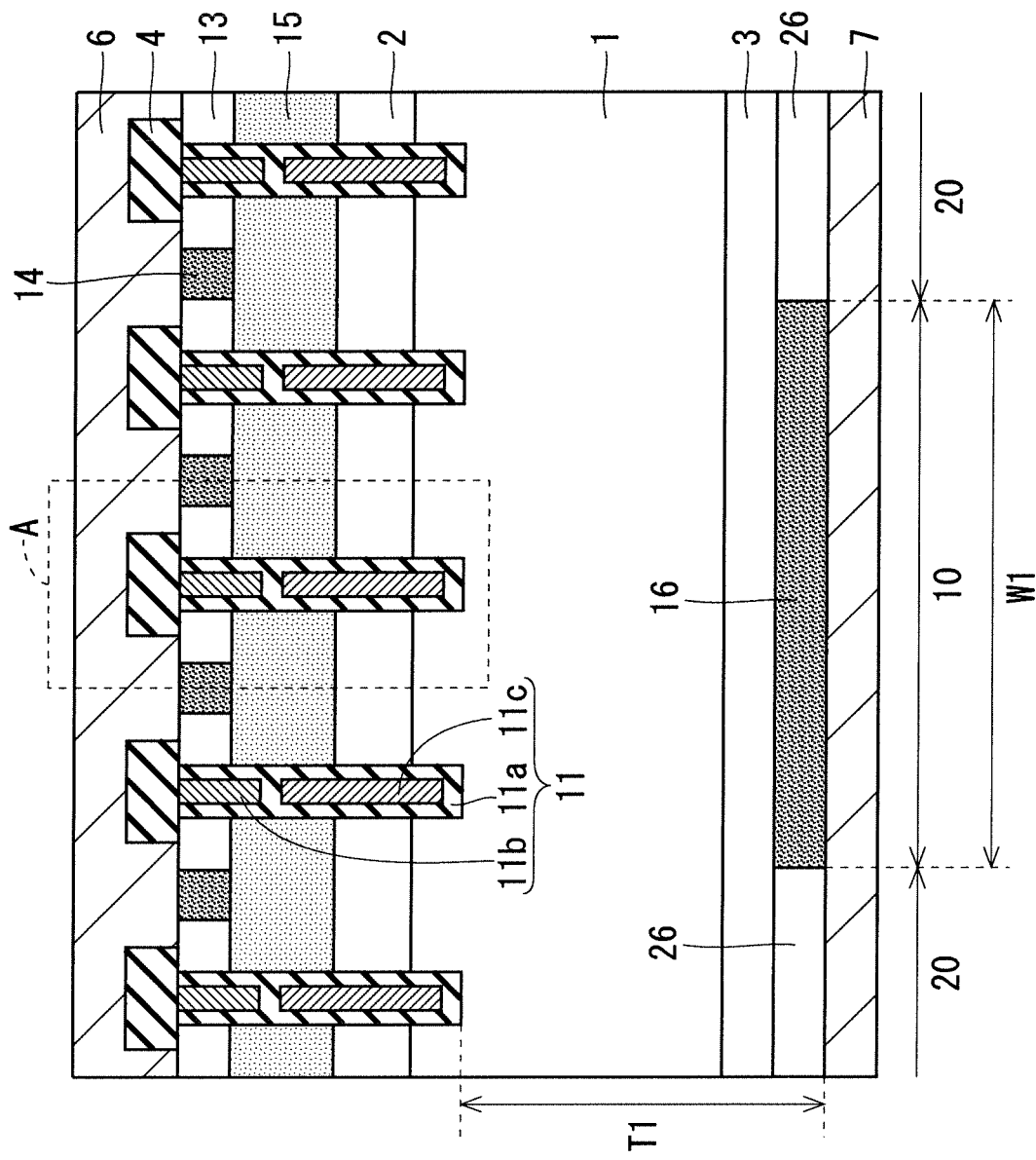
FIGS. 6 and 7 are each a cross-sectional view illustrating a configuration of a semiconductor device according to a third preferred embodiment.

FIG. 6 is a cross-sectional view illustrating a configuration of a semiconductor element included in a semiconductor device according to a third preferred embodiment. In the third preferred embodiment, a plurality of sets of the emitter layer 13, the gate insulating film 11a, the first gate electrode 11b, and the second gate electrode 11c are provided on the first main surface 50a side of the semiconductor substrate 50. That is, a plurality of IGBT cells A is provided on the first main surface 50a side of the semiconductor substrate 50. According to such a configuration, since it is possible to increase a region that operates with an IGBT, it is possible to increase channel density and increase saturation current. The plurality of IGBT cells A may be provided on the entire first main surface 50a of the semiconductor substrate 50.

In the third preferred embodiment, a width W1 of the IGBT region 10 is larger than 2.1 times a distance T1 between the trench of the active trench 11 and the second main surface 50b.

When the semiconductor element operates as an IGBT by input of a positive gate control signal voltage to the first gate electrode 11b and the second gate electrode 11c, carriers injected from the emitter layer 13 flow into the drift layer 1 through an inversion layer adjacent to the active trench 11. A part of the carriers that flow in is accumulated in the drift layer 1, but a part of the other carriers is discharged from the cathode layer 26. When the number of carriers discharged from the cathode layer 26 is large, the resistance of the drift layer 1 increases, and snapback may occur. Therefore, the width W1 of the IGBT region 10 needs to be equal to or more than a certain value so that carriers are sufficiently accumulated in the drift layer 1.

Figure 7:
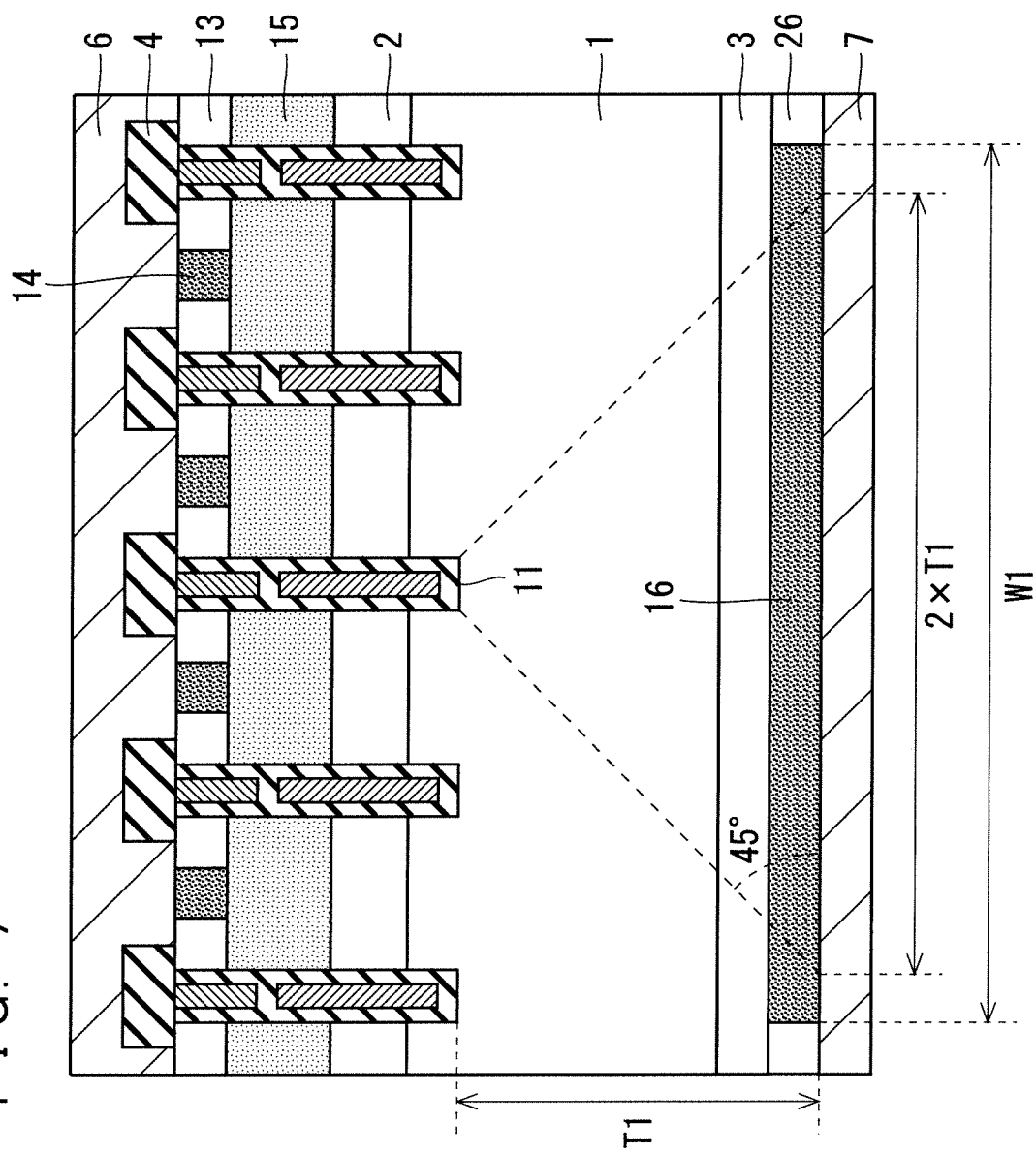

FIG. 7 is a cross-sectional view for explaining the width W1 that is appropriate. Here, it is assumed that the width of the active trench 11 is ignored, and it is assumed that carriers spread 45° from a bottom portion of one active trench 11 toward the collector electrode 7. Assuming as above, a width by which the carrier spreads on the second main surface 50b side is 2×T1. When the width W1 is 2.1 times or more the distance T1, substantially all the carriers supplied from at least one active trench 11 can be accumulated in the drift layer 1. According to the third preferred embodiment, since the width W1 is larger than 2.1 times the distance T1, it is possible to suppress snapback when the semiconductor element operates as an IGBT.

Fourth Preferred Embodiment

Figure 9:
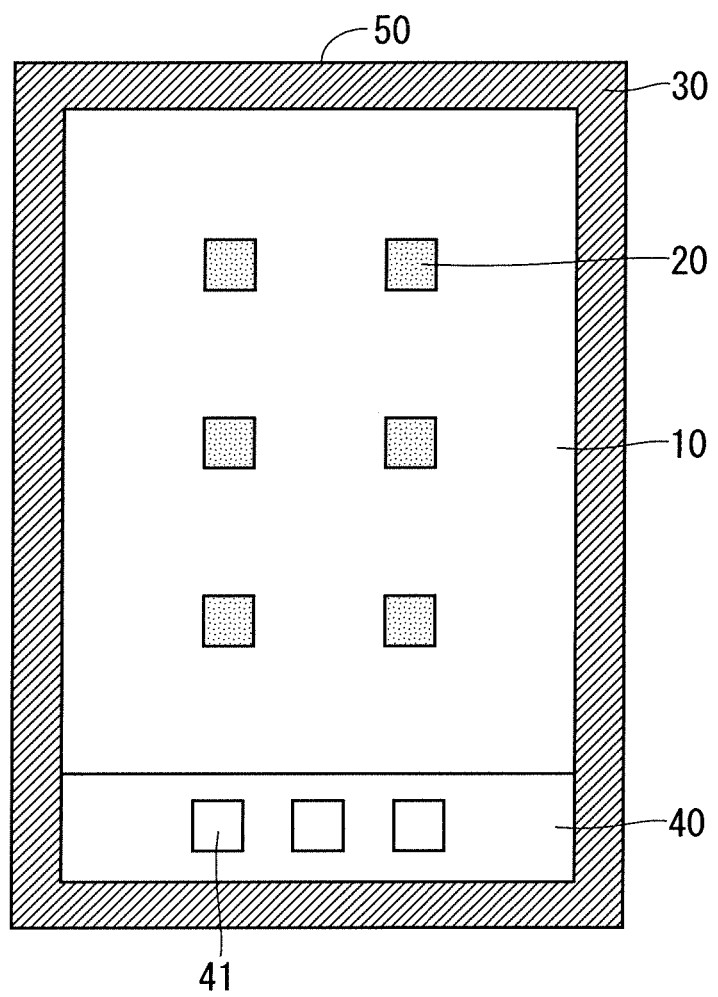

FIGS. 8 and 9 are plan views illustrating a configuration of a semiconductor element included in a semiconductor device according to a fourth preferred embodiment. In the fourth preferred embodiment, in plan view, the IGBT region 10, the diode region 20, a pad region 40 excluding these regions, and a termination region 30 surrounding the IGBT region 10, the diode region 20, and the pad region 40 are provided on the semiconductor substrate 50. Further, a pad 41 is provided in the pad region 40.

The diode region 20 has a quadrangular shape in plan view. The diode regions 20 having a quadrangular shape may be provided in a stripe shape as illustrated in FIG. 8, or may be provided in an island shape as illustrated in FIG. 9. According to the present fourth preferred embodiment, when a chip outer shape is a quadrangle, the diode region 20 can be provided in accordance with the chip outer shape. In this manner, since the width W1 of the IGBT region 10 can be made uniform, current variation in the chip when the semiconductor element operates as an IGBT can be reduced.

Fifth Preferred Embodiment

Figure 10:
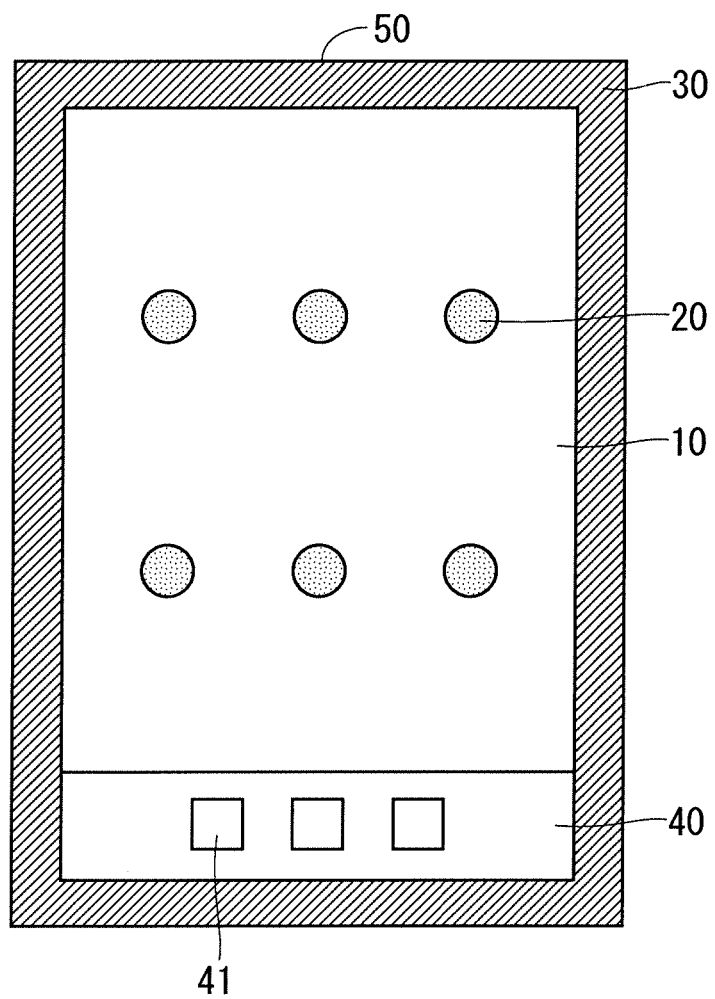
FIGS. 10 and 11 are each a plan view illustrating a configuration of a semiconductor device according to a fifth preferred embodiment.
Figure 11:
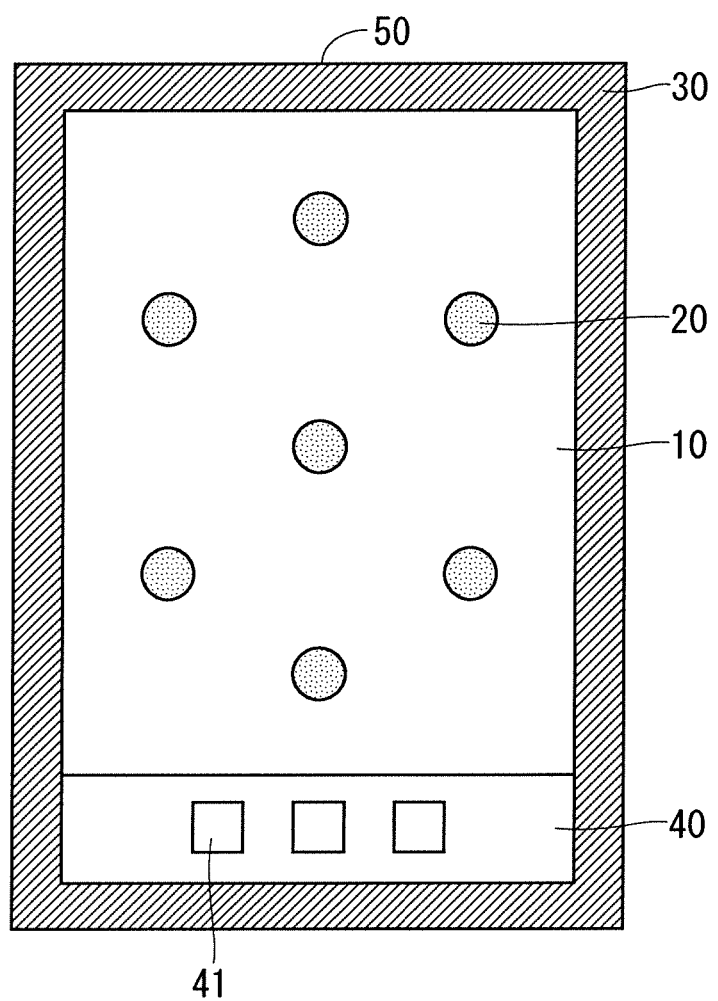

FIGS. 10 and 11 are plan views illustrating a configuration of a semiconductor element included in a semiconductor device according to a fifth preferred embodiment. In the fifth preferred embodiment, as in the fourth preferred embodiment, the IGBT region 10, the diode region 20, the termination region 30, and the pad region 40 are provided on the semiconductor substrate 50 in plan view. In the present fifth preferred embodiment, the diode region 20 has a circular shape in plan view. According to the present fifth preferred embodiment as described above, current concentration at an end portion of the diode region 20 can be suppressed. The same applies to a configuration in which the diode region 20 has a polygonal shape of a pentagon or more in plan view.

Sixth Preferred Embodiment

Figure 13:
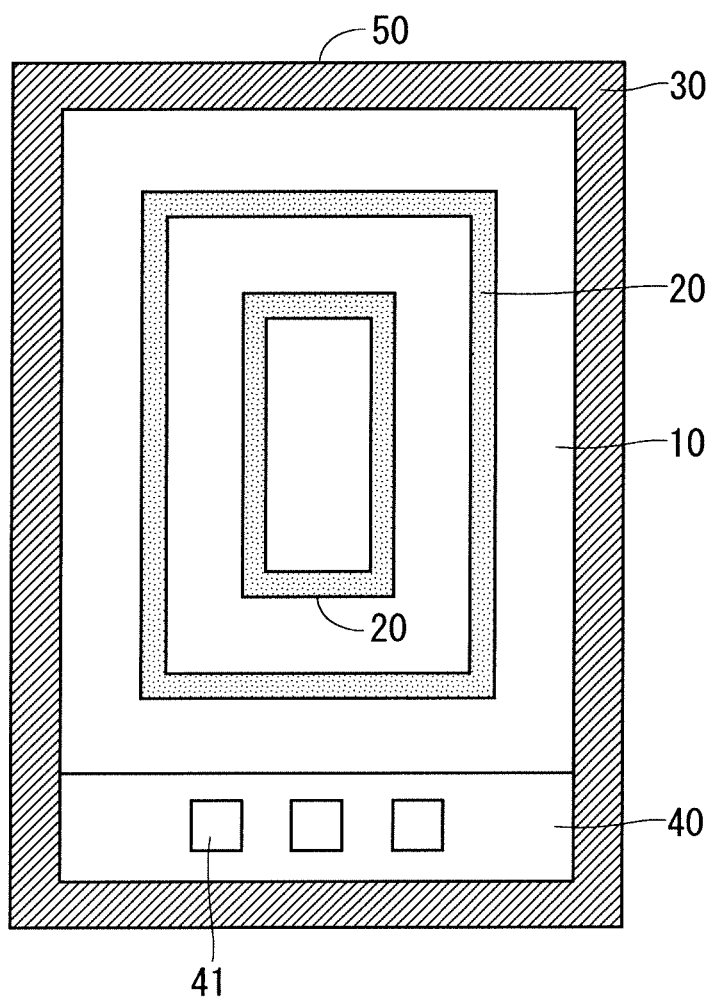

FIGS. 12 and 13 are plan views illustrating a configuration of a semiconductor element included in a semiconductor device according to a sixth preferred embodiment. In the present sixth preferred embodiment, at least a part of the IGBT region 10 is surrounded by the diode region 20 in plan view. At least a part of the IGBT region 10 may be surrounded by the single diode region 20 as illustrated in FIG. 12, or may be surrounded by the double diode region 20 as illustrated in FIG. 13.

Here, heat generated when the semiconductor element operates as an IGBT can be released from a boundary between the IGBT region 10 and the diode region 20 to the diode region 20. In contrast, heat generated when the semiconductor element operates as a diode can be released from the boundary to the IGBT region 10. According to the sixth preferred embodiment, since a length of a boundary line between the IGBT region 10 and the diode region 20 can be made large, the heat dissipation property as described above can be improved.

Seventh Preferred Embodiment

Figure 14:
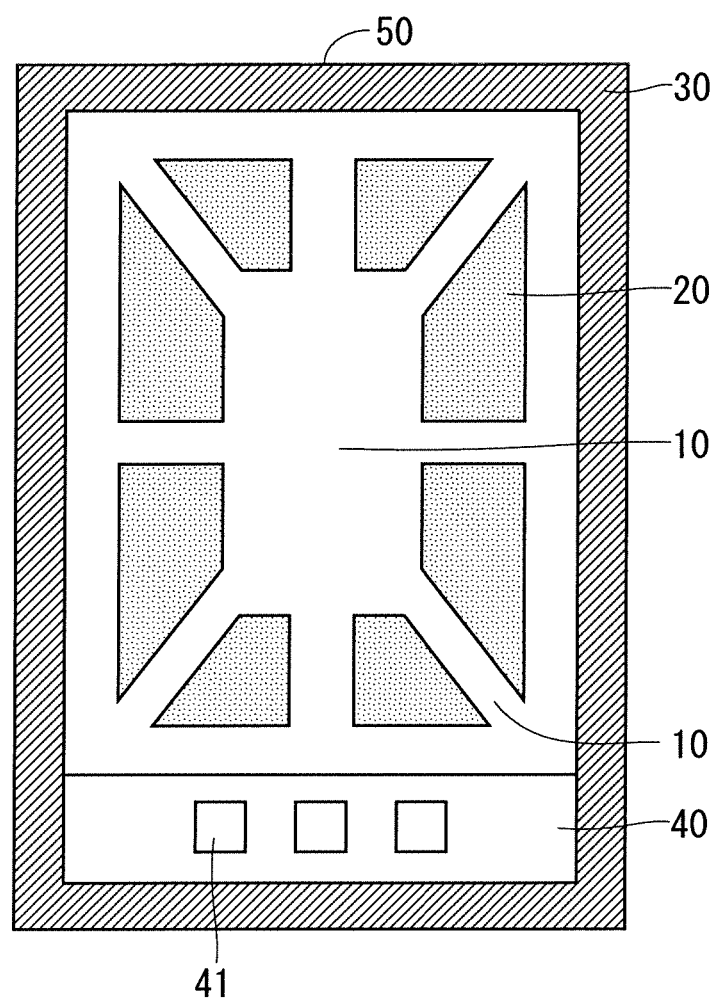
FIGS. 14 and 15 are each a plan view illustrating a configuration of a semiconductor device according to a seventh preferred embodiment.
Figure 15:
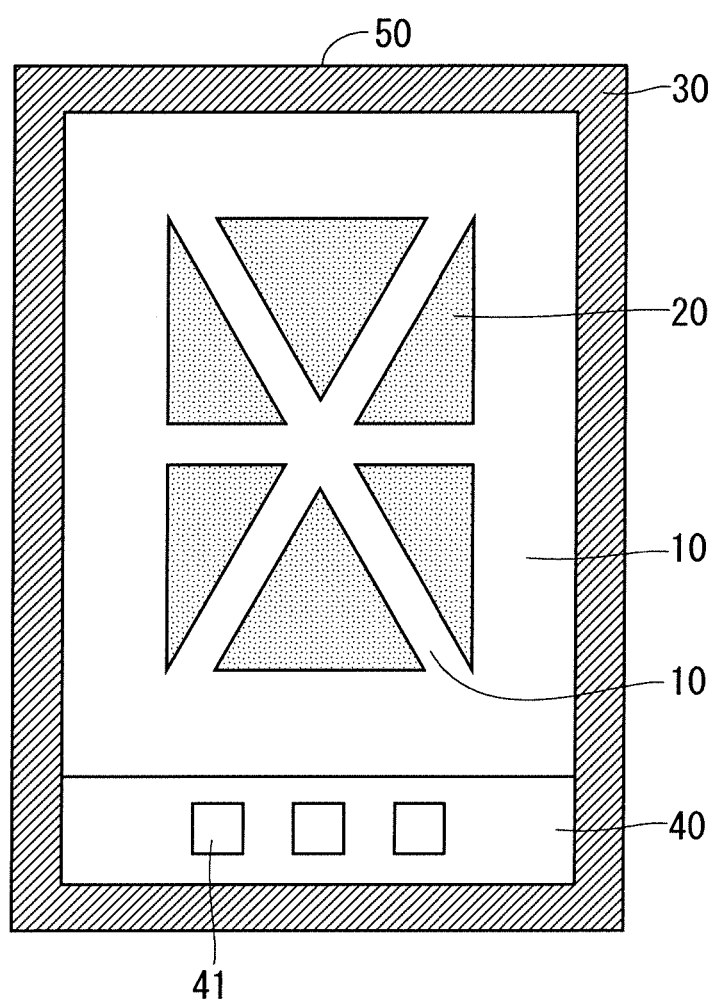

FIGS. 14 and 15 are plan views illustrating a configuration of a semiconductor element included in a semiconductor device according to a seventh preferred embodiment. In the present seventh preferred embodiment, at least a part of the IGBT region 10 has, for example, a shape radially expanding from the center of the chip toward an outer periphery. As illustrated in FIG. 14, in plan view, the IGBT region 10 may include a quadrangular portion provided at the center of the chip and a portion having a shape radially expanding from the quadrangular portion toward the outer periphery. As illustrated in FIG. 15, the IGBT region 10 in plan view may include a portion having an edge of a quadrangular shape along the outer periphery of the chip and a portion having a shape radially expanding from the center of the chip toward the outer periphery.

According to the seventh preferred embodiment, similarly to the sixth preferred embodiment, the length of the boundary line between the IGBT region 10 and the diode region 20 can be made large, so that the heat dissipation property can be improved.

Eighth Preferred Embodiment

Figure 16:
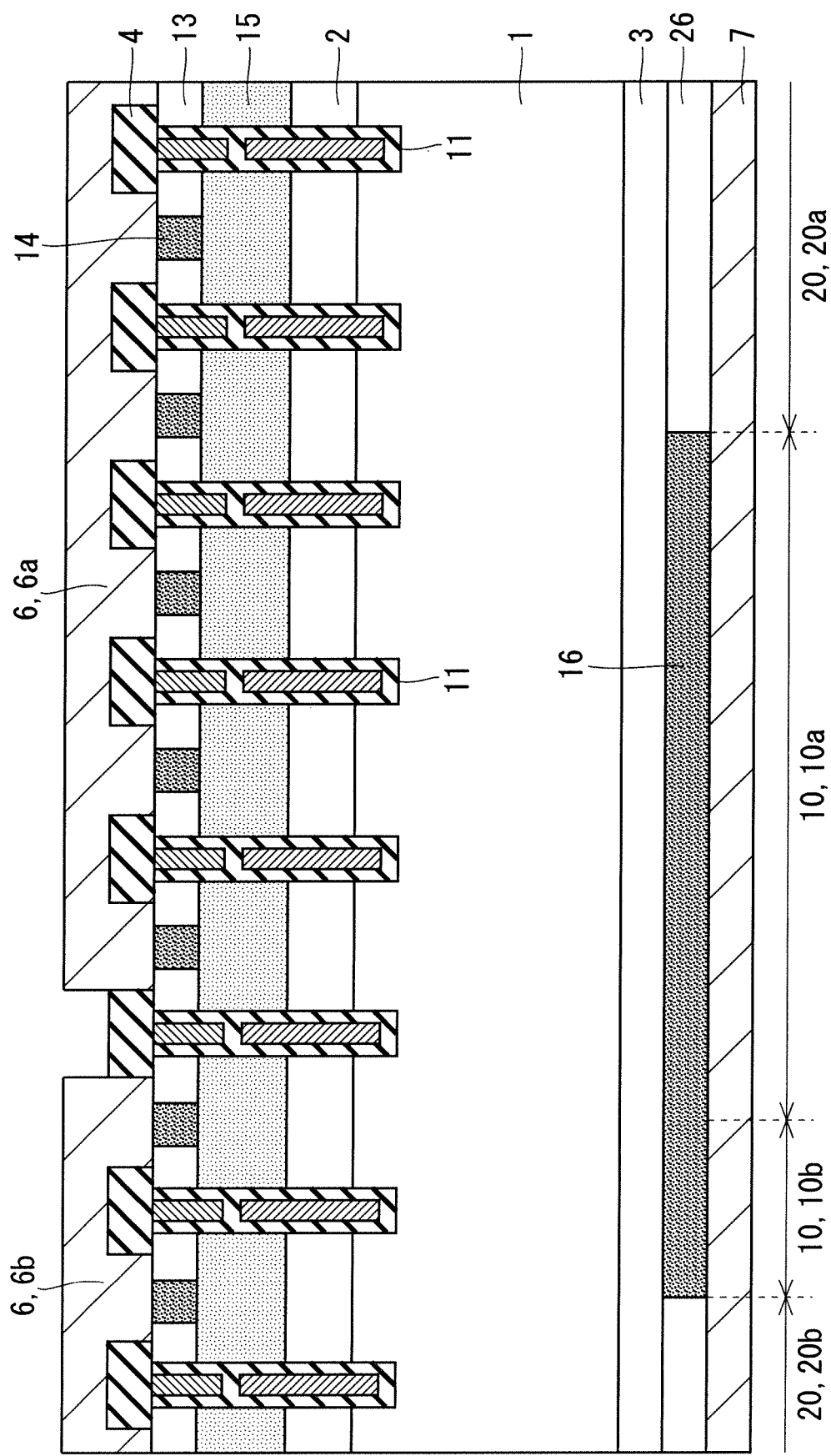
FIG. 16 is a cross-sectional view illustrating a configuration of a semiconductor device according to an eighth preferred embodiment.

FIG. 16 is a cross-sectional view illustrating a configuration of a semiconductor element included in a semiconductor device according to an eighth preferred embodiment. In the eighth preferred embodiment, a plurality of sets of the emitter layer 13, the gate insulating film 11a, the first gate electrode 11b, and the second gate electrode 11c are provided on the first main surface 50a side of the semiconductor substrate 50, and the plurality of IGBT cells A are provided in the IGBT region 10 in plan view.

Further, in the eighth preferred embodiment, the IGBT region 10 includes a main IGBT region 10a that is a first IGBT region and a sense IGBT region 10b that is a second IGBT region. The sense IGBT region 10b is adjacent to the main IGBT region 10a and has an area smaller than that of the main IGBT region 10a. The sense IGBT region 10b is provided with a configuration similar to a configuration provided in the main IGBT region 10a, and is provided with an IGBT for detecting current flowing through the IGBT in the main IGBT region 10a.

In the eighth preferred embodiment, the diode region 20 includes a main diode region 20a that is a first diode region and a sense diode region 20b that is a second diode region. The sense diode region 20b has an area smaller than that of the main diode region 20a. The sense diode region 20b is provided with a configuration similar to a configuration provided in the main diode region 20a, and is provided with a diode for detecting current flowing through a diode of the main diode region 20a.

The emitter electrode 6 includes a main emitter electrode 6a that is a first emitter electrode and a sense emitter electrode 6b that is a second emitter electrode. The main emitter electrode 6a is provided in the main IGBT region 10a and the main diode region 20a. The sense emitter electrode 6b is provided in the sense IGBT region 10b and the sense diode region 20b, and is separated from the main emitter electrode 6a.

According to the present eighth preferred embodiment, the sense IGBT region 10b can detect collector current in a positive direction flowing through the main IGBT region 10a, and the sense diode region 20b can detect collector current in a negative direction flowing through the main diode region 20a. Further, since the sense IGBT region 10b and the main IGBT region 10a are adjacent to each other, a width of the effective collector layer 16 on the second main surface 50b side of the sense IGBT region 10b can be increased, and as a result, snapback can be suppressed.

Ninth Preferred Embodiment

Figure 17:
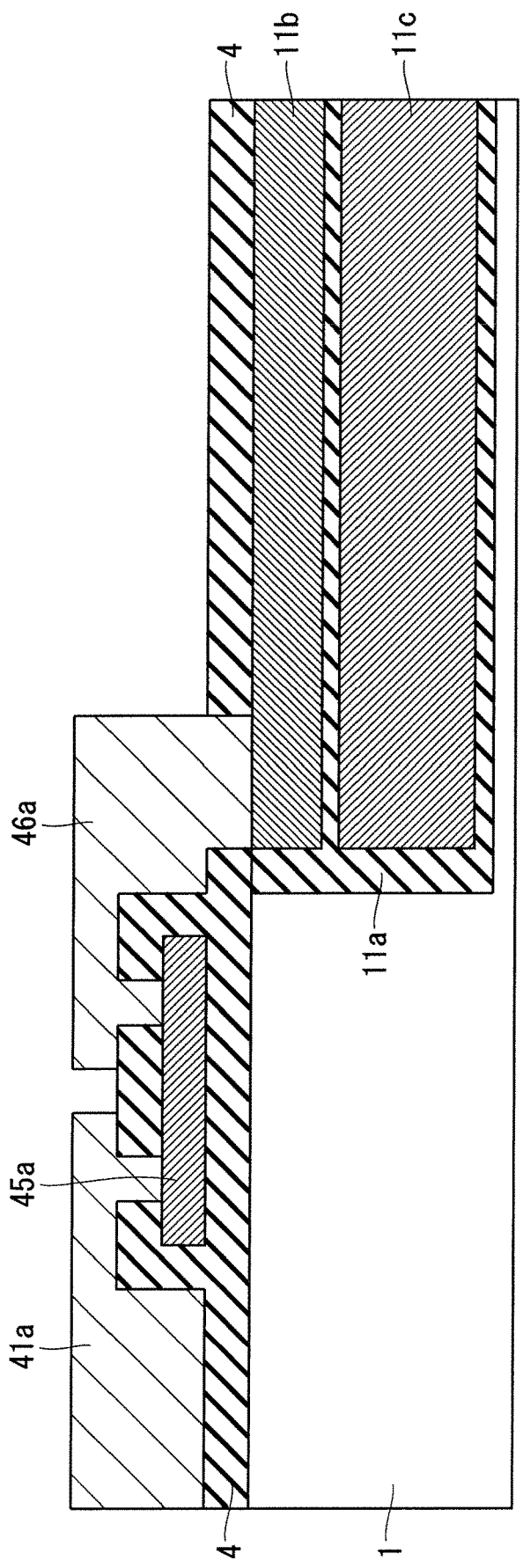
FIGS. 17 and 18 are each a cross-sectional view illustrating a configuration of a semiconductor device according to a ninth preferred embodiment.
Figure 18:
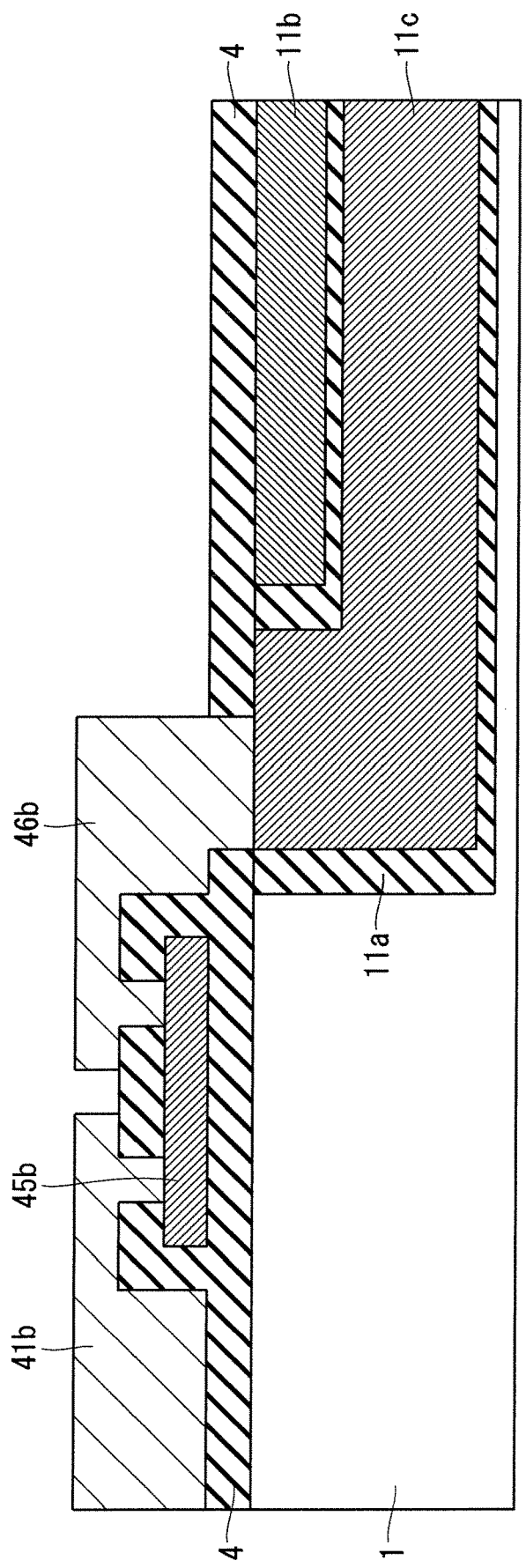

FIGS. 17 and 18 are cross-sectional views illustrating a configuration of a semiconductor element included in a semiconductor device according to a ninth preferred embodiment. The semiconductor substrate 50 of the semiconductor element according to the present ninth preferred embodiment is provided with the pad region 40 excluding the IGBT region 10 and the diode region 20 in plan view as in the fourth preferred embodiment. In the pad region 40, a first gate pad 41a which is a gate pad illustrated in FIG. 17 is provided, and a second gate pad 41b which is a gate pad illustrated in FIG. 18 is provided.

As illustrated in FIG. 17, the first gate electrode 11b and the first gate pad 41a are electrically connected by a first gate wiring 46a and a first built-in gate resistor 45a that is a built-in gate resistor covered with the interlayer insulating film 4. Similarly, as illustrated in FIG. 18, the second gate electrode 11c and the second gate pad 41b are electrically connected by a second gate wiring 46b and a second built-in gate resistor 45b that is a built-in gate resistor covered with the interlayer insulating film 4.

According to the present ninth preferred embodiment, it is possible to reduce an external gate resistor. In FIGS. 17 and 18, the first built-in gate resistor 45a and the second built-in gate resistor 45b are provided on the semiconductor substrate 50, but may be embedded inside the semiconductor substrate 50. Further, it is not necessary to provide both the configuration of FIG. 17 and the configuration of FIG. 18, and one of the configuration of FIG. 17 and the configuration of FIG. 18 may not be provided.

Tenth Preferred Embodiment

Figure 19:
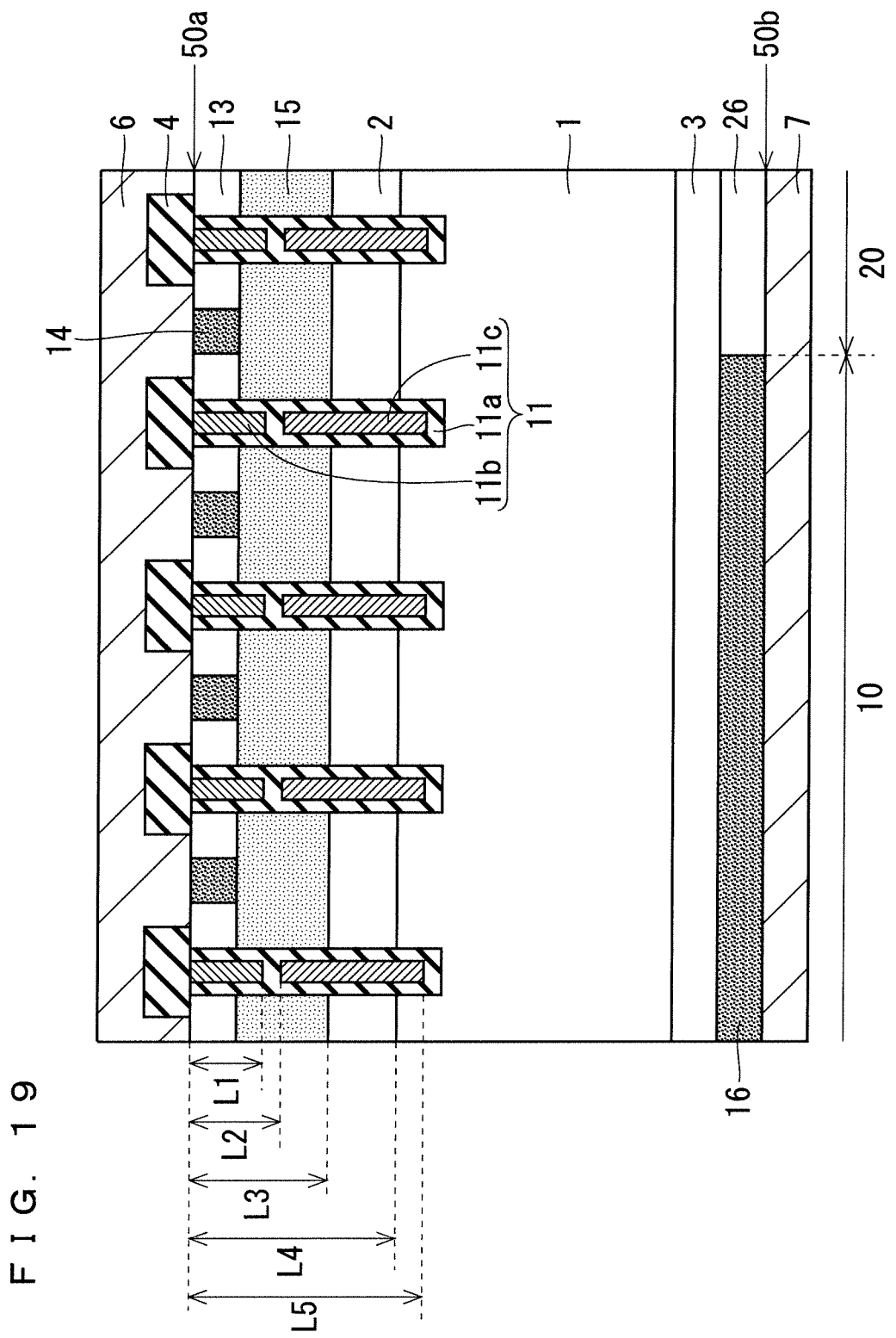
FIG. 19 is a cross-sectional view illustrating a configuration of a semiconductor device according to a tenth preferred embodiment.

FIG. 19 is a cross-sectional view illustrating a configuration of a semiconductor element included in a semiconductor device according to a tenth preferred embodiment. In the present tenth preferred embodiment, a length (=L1) of the first gate electrode 11b is shorter than a length (=L5−L2) of the second gate electrode 11c in a thickness direction of the semiconductor substrate 50.

In the example of FIG. 19, L1 is shorter than a length (=L2) from the first main surface 50a to an end portion of the second gate electrode 11c on the first main surface 50a side.

L2 is shorter than a length (=L3) from the first main surface 50a to the end portion of the base layer 15 on the second main surface 50b side. L3 is shorter than a length (=L4) from the first main surface 50a to an end portion of the carrier accumulation layer 2 on the second main surface 50b side. L4 is shorter than a length (=L5) from the first main surface 50a to an end portion of the second gate electrode 11c on the second main surface 50b side. By setting L1<L2<L3, the operation described in the first preferred embodiment becomes possible. Further, by setting L4<L5, withstand voltage can be improved.

Note that the shorter the L1 and the longer the L5, the thicker the carrier accumulation layer 2 can be. Therefore, by setting L1<L5−L2, the carrier accumulation layer 2 can be made thick, so that an on-voltage VCEsat of an IGBT can be reduced.

Eleventh Preferred Embodiment

Figure 20:
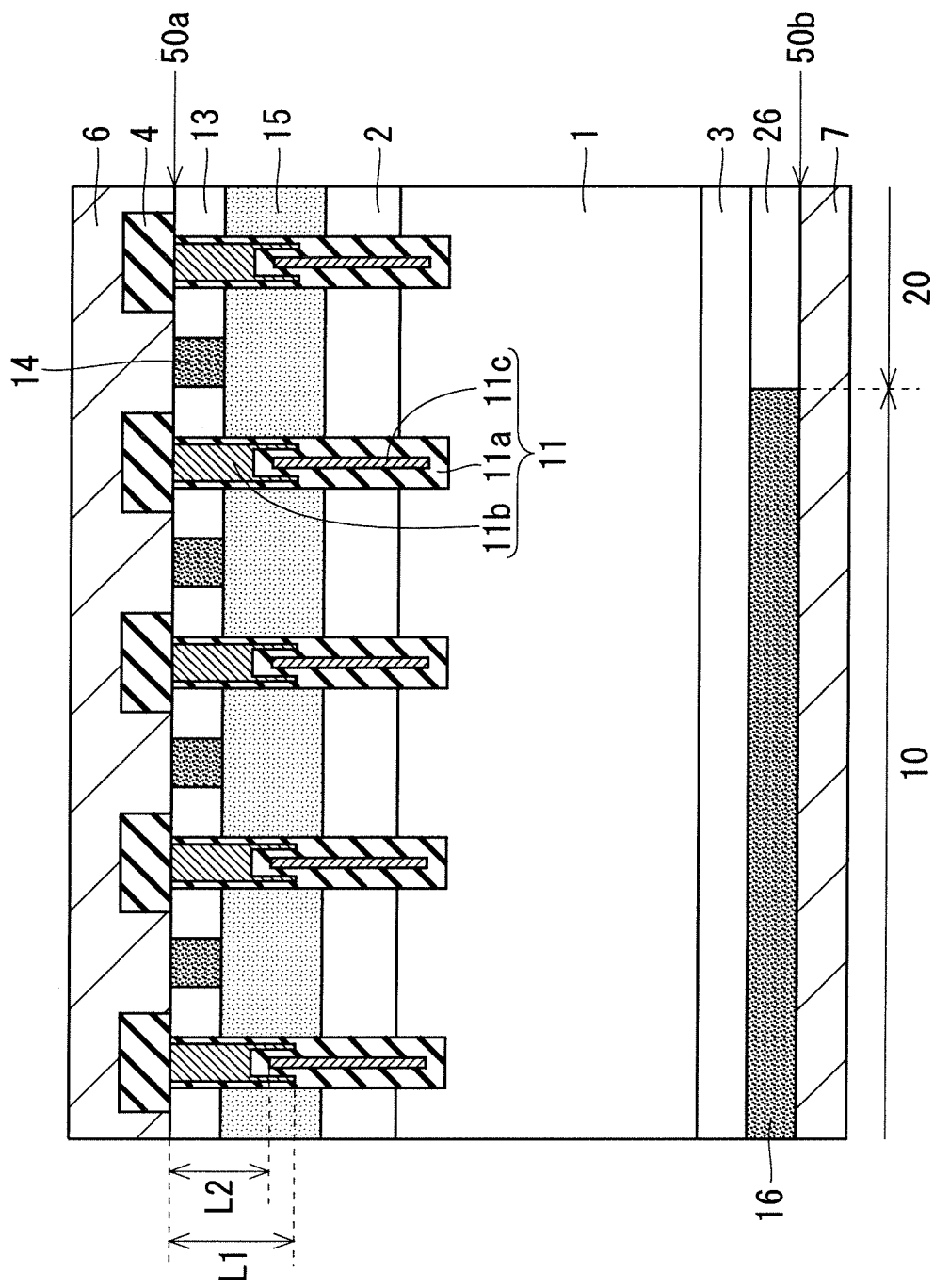
FIG. 20 is a cross-sectional view illustrating a configuration of a semiconductor device according to an eleventh preferred embodiment.

FIG. 20 is a cross-sectional view illustrating a configuration of a semiconductor element included in a semiconductor device according to an eleventh preferred embodiment. In the present eleventh preferred embodiment, an end portion of the first gate electrode 11b on the second main surface 50b side is closer to the second main surface 50b than the end portion of the second gate electrode 11c on the first main surface 50a side. That is, L1>L2 holds between L1 and L2 in FIG. 20. Here, the end portion of the first gate electrode 11b on the second main surface 50b side and the end portion of the second gate electrode 11c on the first main surface 50a side are closer to the second main surface 50b than the end portion of the base layer 15 on the first main surface 50a side, and are closer to the first main surface 50a than the end portion of the base layer 15 on the second main surface 50b side.

According to the present eleventh preferred embodiment as described above, the first gate electrode 11b and the second gate electrode 11c overlap in the thickness direction of the semiconductor substrate 50. For this reason, the inversion layer formed on the base layer 15 adjacent to first gate electrode 11b and second gate electrode 11c can be stabilized.

Twelfth Preferred Embodiment

Figure 21:
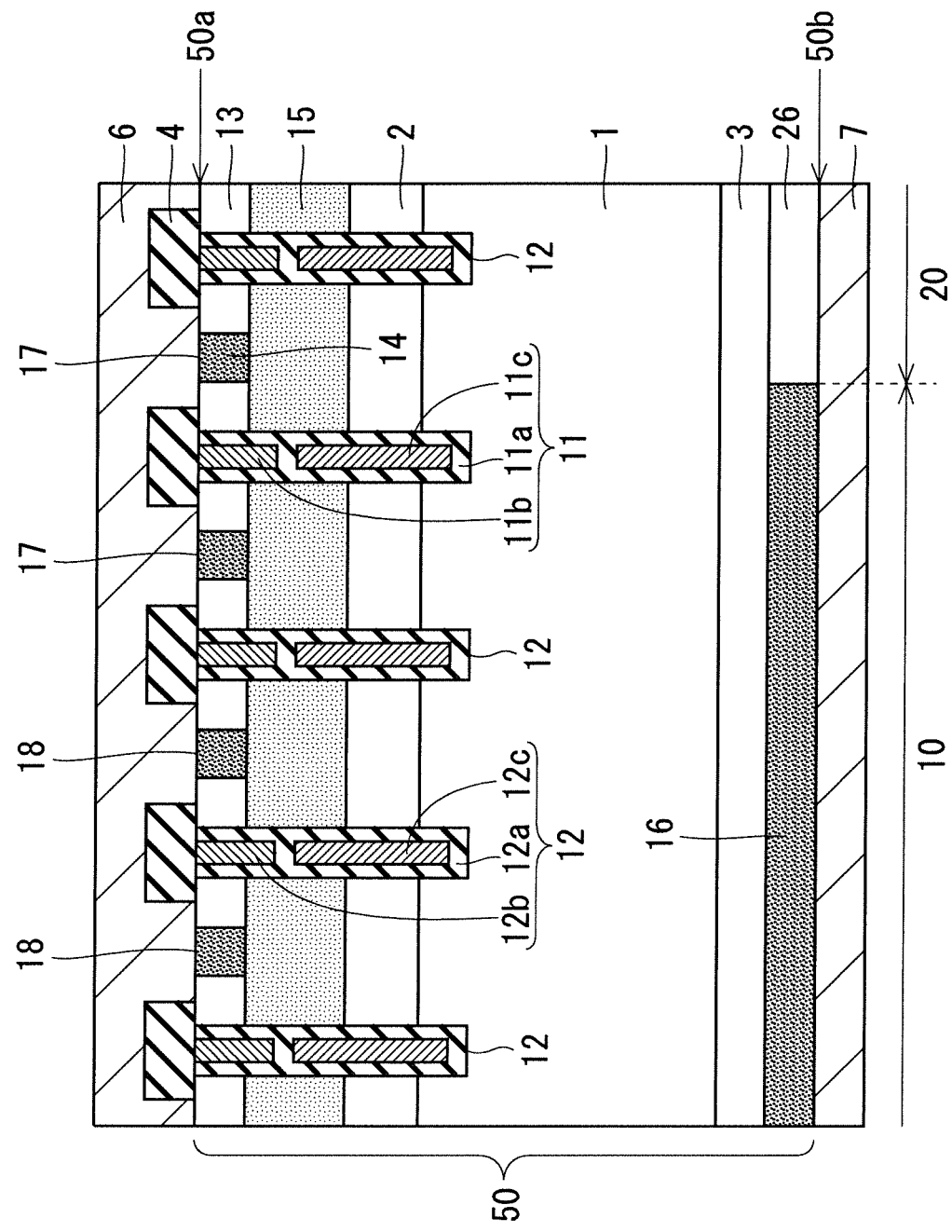
FIG. 21 is a cross-sectional view illustrating a configuration of a semiconductor device according to a twelfth preferred embodiment.

FIG. 21 is a cross-sectional view illustrating a configuration of a semiconductor element included in a semiconductor device according to a twelfth preferred embodiment. The semiconductor element of FIG. 21 includes an insulating film 12a, a first electrode 12b, and a second electrode 12c corresponding to the gate insulating film 11a, the first gate electrode 11b, and the second gate electrode 11c, respectively, in addition to the constituent element of the semiconductor element of FIG. 1. Except that the first electrode 12b and the second electrode 12c are electrically connected to the emitter electrode 6, the insulating film 12a, the first electrode 12b, and the second electrode 12c are substantially the same as the gate insulating film 11a, the first gate electrode 11b, and the second gate electrode 11c, respectively. Due to the difference in connection, while the gate insulating film 11a, the first gate electrode 11b, and the second gate electrode 11c constitute the active trench 11, the insulating film 12a, the first electrode 12b, and the second electrode 12c constitute a dummy trench 12.

The semiconductor substrate 50 in FIG. 21 includes a dummy mesa 18 corresponding to an active mesa 17 including the carrier accumulation layer 2, the base layer 15, the emitter layer 13, and the contact layer 14. Note that the active mesa 17 is included in the concept of a first stacked structure, and the dummy mesa 18 is included in the concept of a second stacked structure.

The active mesa 17 is adjacent to the active trench 11 including the gate insulating film 11a, whereas the dummy mesa 18 is adjacent to the dummy trench 12 including the insulating film 12a. Except for this point, the dummy mesa 18 is substantially the same as the active mesa 17. As illustrated in FIG. 21, the dummy mesa 18 may be connected to the emitter electrode 6 via the opening portion provided in the interlayer insulating film 4. Although not illustrated, the configuration may be such that the opening portion is not be provided in the interlayer insulating film 4, and the potential of the dummy mesa 18 is floating potential.

According to the present twelfth preferred embodiment as described above, the capacitance can be reduced by the dummy trench 12. Further, in the present twelfth preferred embodiment, in the active mesa 17 and the dummy mesa 18, diffusion layers such as the carrier accumulation layer 2, the base layer 15, the emitter layer 13, and the contact layer 14 are substantially the same. For this reason, the active trench 11 and the dummy trench 12 can be formed in a different manner depending on whether or not the connection target of the first gate electrode 11b and the second gate electrode 11c is changed to the emitter electrode 6. Further, since they can be formed in a different manner only by, for example, changing a contact pattern, productivity can be improved.

Thirteenth Preferred Embodiment

Figure 22:
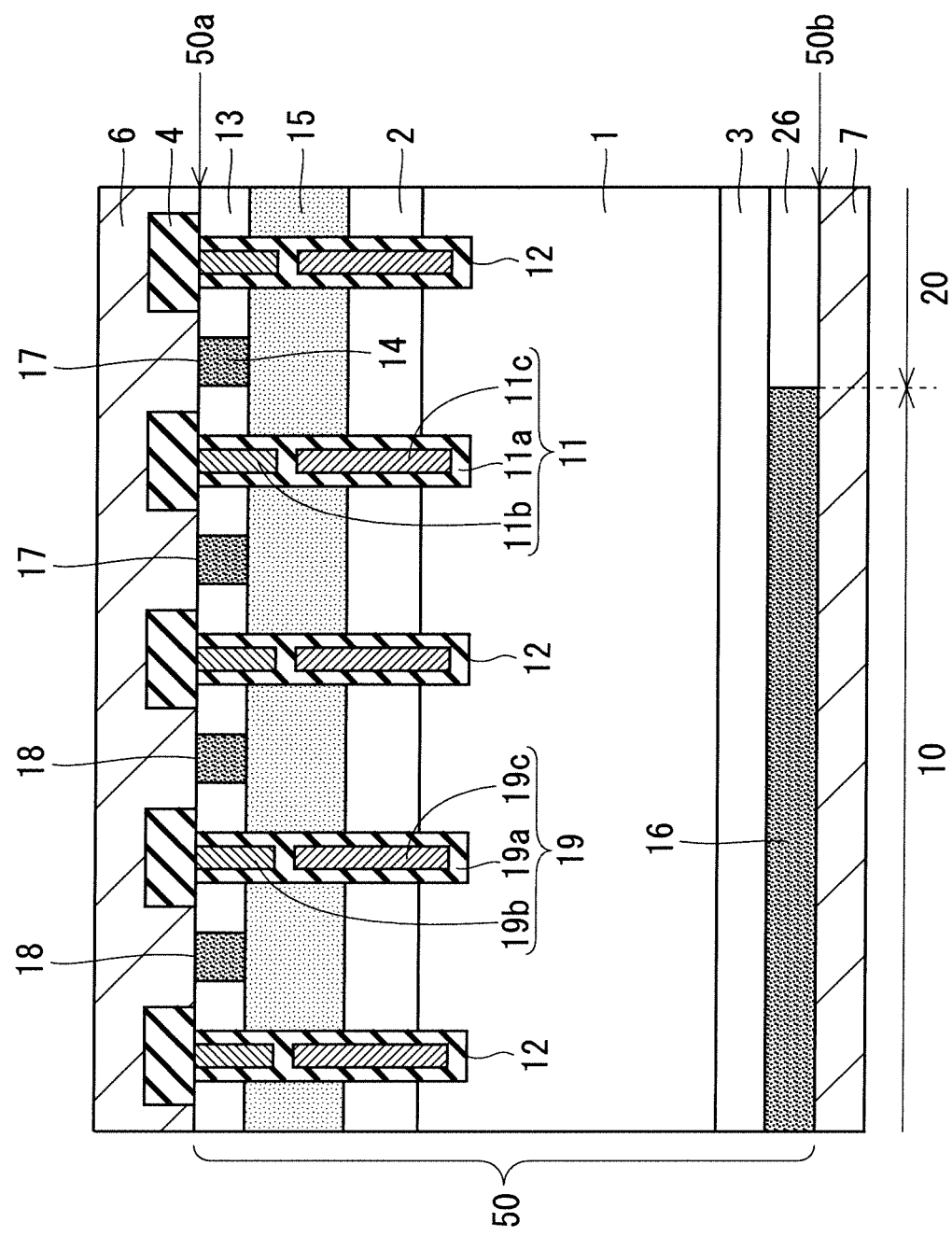
FIG. 22 is a cross-sectional view illustrating a configuration of a semiconductor device according to a thirteenth preferred embodiment.

FIG. 22 is a cross-sectional view illustrating a configuration of a semiconductor element included in a semiconductor device according to a thirteenth preferred embodiment. The semiconductor element of FIG. 22 includes an insulating film 19a, a first electrode 19b, and a second electrode 19c corresponding to the gate insulating film 11a, the first gate electrode 11b, and the second gate electrode 11c, respectively, in addition to the constituent element of the semiconductor element of FIG. 1. A first one of the first electrode 19b and the second electrode 19c is electrically connected to the emitter electrode 6, and a second one of the first electrode 19b and the second electrode 19c is electrically connected to the first gate electrode 11b. Except for this point, the insulating film 19a, the first electrode 19b, and the second electrode 19c are substantially the same as the gate insulating film 11a, the first gate electrode 11b, and the second gate electrode 11c, respectively. Due to the difference in connection, while the gate insulating film 11a, the first gate electrode 11b, and the second gate electrode 11c constitute the active trench 11, the insulating film 19a, the first electrode 19b, and the second electrode 19c constitute a dummy active trench 19.

The semiconductor substrate 50 in FIG. 22 includes the dummy mesa 18 corresponding to the active mesa 17 including the carrier accumulation layer 2, the base layer 15, the emitter layer 13, and the contact layer 14. Note that the active mesa 17 is included in the concept of the first stacked structure, and the dummy mesa 18 is included in the concept of the second stacked structure.

The active mesa 17 is adjacent to the active trench 11 including the gate insulating film 11a, whereas the dummy mesa 18 is adjacent to the dummy active trench 19 including the insulating film 19a. Except for this point, the dummy mesa 18 is substantially the same as the active mesa 17.

According to the present thirteenth preferred embodiment as described above, a capacitance ratio, that is, feedback capacitance/input capacitance can be adjusted by the dummy active trench 19. For example, when the first electrode 19b is connected to the emitter electrode 6 and the second electrode 19c is connected to the first gate electrode 11b of the active trench 11, feedback capacitance is increased by the second electrode 19c, so that the capacitance ratio can be increased. Conversely, when the first electrode 19b is connected to the first gate electrode 11b of the active trench 11 and the second electrode 19c is connected to the emitter electrode 6, input capacitance is increased by the first electrode 19b, so that the capacitance ratio can be reduced.

Fourteenth Preferred Embodiment

Figure 23:
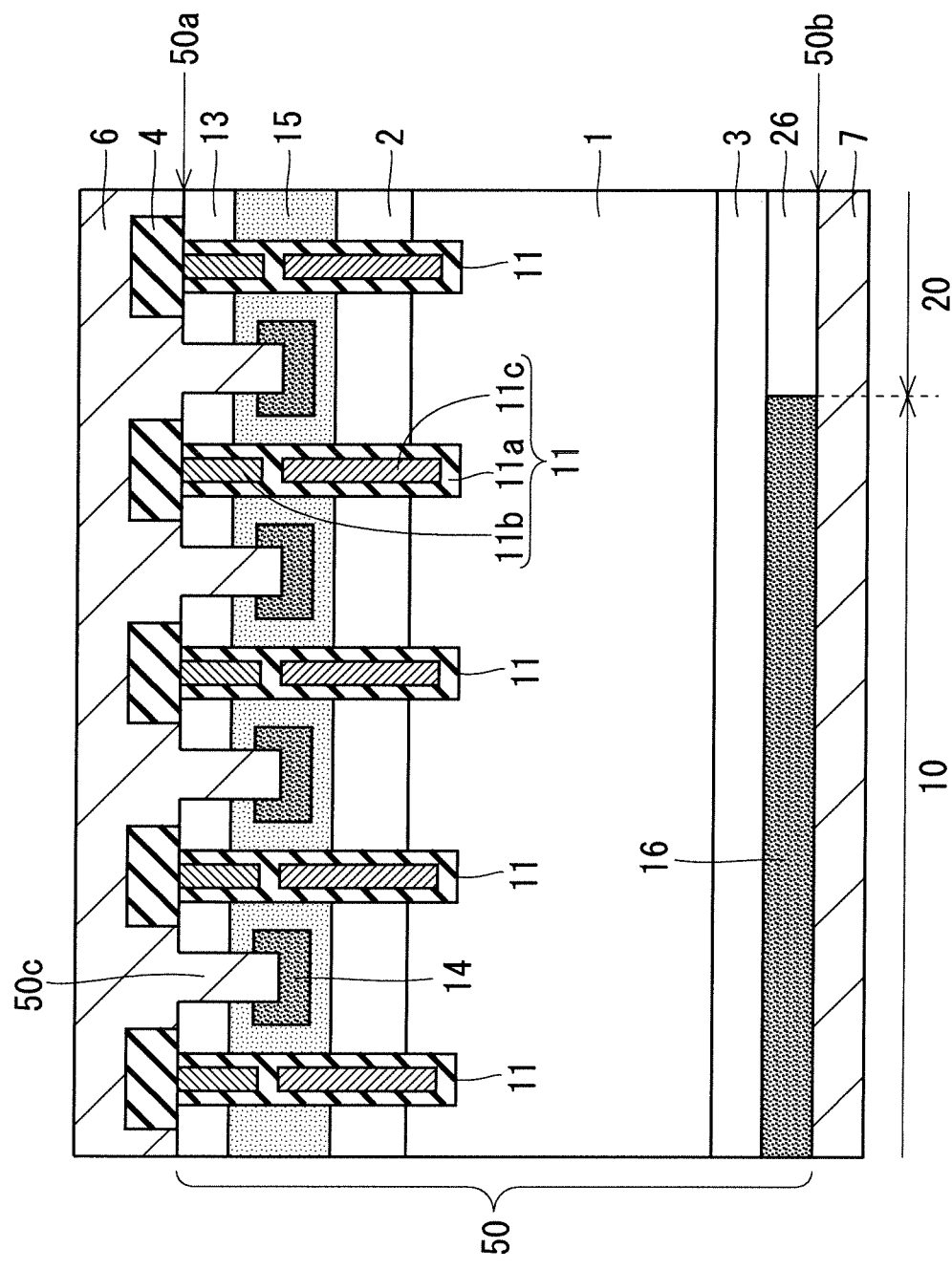
FIG. 23 is a cross-sectional view illustrating a configuration of a semiconductor device according to a fourteenth preferred embodiment.

FIG. 23 is a cross-sectional view illustrating a configuration of a semiconductor element included in a semiconductor device according to a fourteenth preferred embodiment. In addition to the first preferred embodiment, the semiconductor element in FIG. 23 is provided with a contact trench 50c that penetrates the emitter layer 13 from the first main surface 50a side of the active mesa 17 and reaches the base layer 15. A part of the emitter electrode 6 is provided in the contact trench 50c, and the contact layer 14 is provided at a bottom portion of the contact trench 50c. According to the present fourteenth preferred embodiment as described above, it is possible to enhance hole extraction performance at the time of turn-off of the semiconductor element operating as an IGBT, and thus, it is possible to improve latch-up tolerance.

Fifteenth Preferred Embodiment

Figure 24:
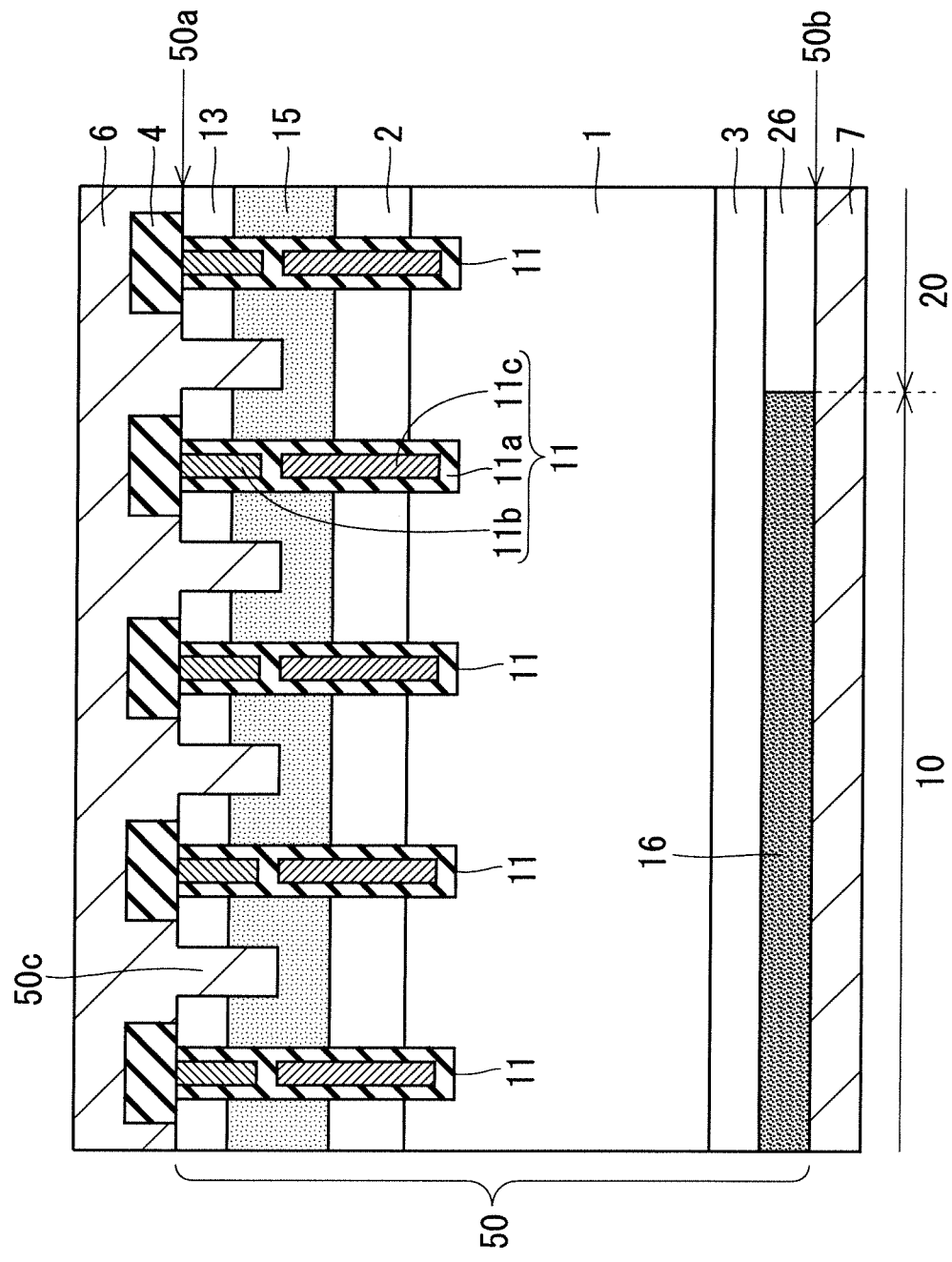
FIG. 24 is a cross-sectional view illustrating a configuration of a semiconductor device according to a fifteenth preferred embodiment.

FIG. 24 is a cross-sectional view illustrating a configuration of a semiconductor element included in a semiconductor device according to a fifteenth preferred embodiment. In the semiconductor element of FIG. 24, the contact layer 14 is not provided at the bottom portion of the contact trench 50c in the fourteenth preferred embodiment, and a part of the emitter electrode 6 is in contact with the base layer 15 at a side wall and the bottom portion of the contact trench 50c. According to the present fifteenth preferred embodiment as described above, since the contact layer 14 having high concentration is not provided, carrier injection efficiency from the first main surface 50a side of the semiconductor element operating as a diode can be reduced, and recovery loss can be reduced.

<Variation>

Various developments may be performed in the preferred embodiments described above. For example, the preferred embodiments described above can be applied without limitation to a withstand voltage class of the semiconductor element and whether the semiconductor substrate 50 is any of an FZ substrate/an MCZ substrate/an epitaxial substrate. Further, a material of the semiconductor substrate 50 may be normal silicon (Si) or a wide band gap semiconductor of silicon carbide (SiC), gallium nitride (GaN), diamond or the like. In a case where the material of the semiconductor substrate 50 is a wide band gap semiconductor, stable operation under high temperature and high voltage, and high switching speed can be achieved. Further, different preferred embodiments can be combined, and a certain preferred embodiment can be partially applied to another preferred embodiment.

Note that the preferred embodiments and the variations can be freely combined, and the preferred embodiments and the variations can be appropriately modified or omitted.

While the disclosure has been shown and described in detail, the foregoing description is in all aspects illustrative and not restrictive. It is therefore understood that numerous modifications and variations can be devised.

What is claimed is:

1. A semiconductor device comprising
a semiconductor substrate including a first main surface and a second main surface opposite to the first main surface, wherein
the semiconductor substrate includes
   a drift layer of a first conductivity type provided between the first main surface and the second main surface,
   a carrier accumulation layer of the first conductivity type provided on the first main surface side of the drift layer,
   a base layer of a second conductivity type provided on the first main surface side of the carrier accumulation layer,
   an emitter layer of the first conductivity type selectively provided on the first main surface side of the base layer,
   a buffer layer of the first conductivity type provided on the second main surface side of the drift layer, and
   a collector layer of the second conductivity type and a cathode layer of the first conductivity type provided on the second main surface side of the buffer layer,
the semiconductor device further comprising:
a gate insulating film provided on an inner wall of a trench that penetrates the emitter layer, the base layer, and the carrier accumulation layer from the first main surface side and reaches the drift layer;
a first gate electrode provided on the inner wall on the first main surface side with the gate insulating film interposed therebetween, and having an end portion closer to the second main surface than an end portion of the base layer on the first main surface side;
a second gate electrode insulated from the first gate electrode, provided on the inner wall on the second main surface side with the gate insulating film interposed therebetween, and having an end portion closer to the first main surface than an end portion of the base layer on the second main surface side;
an emitter electrode provided on the first main surface;
a collector electrode provided on the second main surface; and
a control unit configured to apply gate voltages to the first gate electrode and the second gate electrode and configured to determine whether current flows from the collector electrode to the emitter electrode or from the emitter electrode to the collector electrode, wherein
in a case where the control unit applies a positive gate voltage to a first one of the first gate electrode and the second gate electrode, and the control unit determines that current flows from the collector electrode to the emitter electrode, the control unit is configured to apply a positive gate voltage to a second one of the first gate electrode and the second gate electrode, and
in a case where the control unit applies a positive gate voltage to the first one, and the control unit determines that current flows from the emitter electrode to the collector electrode, the control unit is configured to apply a voltage equal to or less than a reference voltage to the second one.

2. The semiconductor device according to claim 1, wherein the control unit is configured to apply a positive gate voltage to both the first one and the second one before a voltage applied to the first one is switched from a positive gate voltage to a voltage equal to or less than the reference voltage.

3. The semiconductor device according to claim 1, wherein
a plurality of sets of the emitter layer, the gate insulating film, the first gate electrode, and the second gate electrode are provided on the first main surface side, and
a width of an IGBT region corresponding to the collector layer in plan view is larger than 2.1 times a distance between the trench and the second main surface.

4. The semiconductor device according to claim 1, wherein
a diode region corresponding to the cathode layer in plan view has a quadrangular shape.

5. The semiconductor device according to claim 1, wherein
a diode region corresponding to the cathode layer in plan view has a polygonal shape of a pentagon or more, or a circular shape.

6. The semiconductor device according to claim 1, wherein
at least a part of an IGBT region corresponding to the collector layer is surrounded by a diode region corresponding to the cathode layer in plan view.

7. The semiconductor device according to claim 1, wherein
at least a part of an IGBT region corresponding to the collector layer in plan view has a radially expanding shape.

8. The semiconductor device according to claim 1, wherein
a plurality of sets of the emitter layer, the gate insulating film, the first gate electrode, and the second gate electrode are provided on the first main surface side,
an IGBT region corresponding to the collector layer in plan view includes
a first IGBT region and a second IGBT region that is smaller in area than the first IGBT region and is adjacent to the first IGBT region,
a diode region corresponding to the cathode layer in plan view includes a first diode region and a second diode region smaller in area than the first diode region, and
the emitter electrode includes a first emitter electrode provided in the first IGBT region and the first diode region, and a second emitter electrode provided in the second IGBT region and the second diode region and separated from the first emitter electrode.

9. The semiconductor device according to claim 1, further comprising:
a gate pad provided in a pad region of the semiconductor substrate excluding an IGBT region corresponding to the collector layer and a diode region corresponding to the cathode layer in plan view; and
a built-in gate resistor electrically connecting the gate pad and the first gate electrode or the second gate electrode.

10. The semiconductor device according to claim 1, wherein
a length of the first gate electrode is shorter than a length of the second gate electrode in a thickness direction of the semiconductor substrate.

11. The semiconductor device according to claim 1, wherein
the end portion of the first gate electrode on the second main surface side is closer to the second main surface than the end portion of the second gate electrode on the first main surface side.

12. The semiconductor device according to claim 1, further comprising
an insulating film, a first electrode, and a second electrode respectively corresponding to the gate insulating film, the first gate electrode, and the second gate electrode, wherein
the semiconductor substrate further includes
a second stacked structure corresponding to a first stacked structure including the carrier accumulation layer, the base layer, and the emitter layer and adjacent to the insulating film, and
the first electrode and the second electrode are electrically connected to the emitter electrode.

13. The semiconductor device according to claim 1, further comprising
an insulating film, a first electrode, and a second electrode respectively corresponding to the gate insulating film, the first gate electrode, and the second gate electrode, wherein
the semiconductor substrate further includes
a second stacked structure corresponding to a first stacked structure including the carrier accumulation layer, the base layer, and the emitter layer and adjacent to the insulating film,
a first one of the first electrode and the second electrode is electrically connected to the emitter electrode, and
a second one of the first electrode and the second electrode is electrically connected to the first gate electrode.

14. The semiconductor device according to claim 1, wherein
a part of the emitter electrode is provided in a contact trench that penetrates the emitter layer from the first main surface side and reaches the base layer,
the semiconductor device further comprising
a contact layer of the second conductivity type provided at a bottom portion of the contact trench.

15. The semiconductor device according to claim 1, wherein
a part of the emitter electrode is provided in a contact trench that penetrates the emitter layer from the first main surface side and reaches the base layer.

16. A method for controlling a semiconductor device, wherein
the semiconductor device includes a semiconductor substrate including a first main surface and a second main surface opposite to the first main surface,
the semiconductor substrate includes
a drift layer of a first conductivity type provided between the first main surface and the second main surface,
a carrier accumulation layer of the first conductivity type provided on the first main surface side of the drift layer,
a base layer of a second conductivity type provided on the first main surface side of the carrier accumulation layer,
an emitter layer of the first conductivity type selectively provided on the first main surface side of the base layer,
a buffer layer of the first conductivity type provided on the second main surface side of the drift layer, and
a collector layer of the second conductivity type and a cathode layer of the first conductivity type provided on the second main surface side of the buffer layer, the semiconductor device further includes
a gate insulating film provided on an inner wall of a trench that penetrates the emitter layer, the base layer, and the carrier accumulation layer from the first main surface side and reaches the drift layer,
a first gate electrode provided on the inner wall on the first main surface side with the gate insulating film interposed therebetween, and having an end portion closer to the second main surface than an end portion of the base layer on the first main surface side,
a second gate electrode insulated from the first gate electrode, provided on the inner wall on the second main surface side with the gate insulating film interposed therebetween, and having an end portion closer to the first main surface than an end portion of the base layer on the second main surface side,
an emitter electrode provided on the first main surface, and
a collector electrode provided on the second main surface, the method comprising applying a positive gate voltage to a first one of the first gate electrode and the second gate electrode,
determining whether current flows from the collector electrode to the emitter electrode or from the emitter electrode to the collector electrode,
while applying the positive gate voltage to the first one, in a case where current flows from the collector electrode to the emitter electrode, applying a positive gate voltage to a second one of the first gate electrode and the second gate electrode, and
while applying the positive gate voltage to the first one, in a case where current flows from the emitter electrode to the collector electrode, applying a voltage equal to or less than a reference voltage to the second one.

17. The semiconductor device according to claim 1, wherein
the reference voltage is 0 V.

18. The method according to claim 16, wherein
the reference voltage is 0 V.

* * * * *